United States Patent [19]
Hsu et al.

[11] Patent Number: 5,843,799
[45] Date of Patent: Dec. 1, 1998

[54] CIRCUIT MODULE REDUNDANCY ARCHITECTURE PROCESS

[75] Inventors: Fu-Chieh Hsu, Saratoga; Wingyu Leung, Cupertino, both of Calif.

[73] Assignee: Monolithic System Technology, Inc., Sunnyvale, Calif.

[21] Appl. No.: 782,135

[22] Filed: Jan. 13, 1997

Related U.S. Application Data

[62] Division of Ser. No. 553,217, Nov. 7, 1995, abandoned, which is a division of Ser. No. 246,396, May 20, 1994, Pat. No. 5,498,886, which is a continuation of Ser. No. 865,410, Apr. 8, 1992, abandoned, which is a continuation-in-part of Ser. No. 787,984, Nov. 5, 1991, abandoned.

[51] Int. Cl.[6] .................................................. H01L 21/00
[52] U.S. Cl. ..................................................................... 438/6
[58] Field of Search ................................. 371/10.2, 10.3; 257/48; 437/8; 438/6

[56] References Cited

U.S. PATENT DOCUMENTS

| | | | |
|---|---|---|---|
| 3,585,378 | 6/1971 | Bouricius et al. | 235/153 |
| 3,651,473 | 3/1972 | Faber | 340/172.5 |

(List continued on next page.)

FOREIGN PATENT DOCUMENTS

| | | |
|---|---|---|
| 0 178 949 | 4/1986 | European Pat. Off. . |
| 0 389 203 | 9/1990 | European Pat. Off. . |
| 59-212962 | 12/1984 | Japan . |
| WO-90/16680 | 10/1991 | WIPO . |
| WO-93/18459 | 6/1993 | WIPO . |
| WO 93/18463 | 9/1993 | WIPO . |
| WO-93/18463 | 9/1993 | WIPO . |

OTHER PUBLICATIONS

Peter van Zant, *Microchip, A Practical Guide to Semiconductor Processing*, 1st Ed., Semiconductor Services, San Jose, CA 1986, p. 8.

MacDonald et al., "Dynamic RAMs 200mb Wafer Memory," IEEE ISSCC, Feb. 17, 1989, pp. 240–241 and 350.

Cavill et al., "Wafer–Scale Integration," Microelectronics Manufacturing Technology, May, 1991, pp. 55–59.

Ron Iscoff, "Characterizing Quickturn ASICs: It's Done with Mirrors" semiconductor International, Aug. 1, 1990, pp. 68–73.

Takai et al., "250 Mbyte/s Synchronous DRAM Using a 3–Stage–Pipelined Architecture," IEEE Jnl of Solid State Circuits, vol. 29, No. 4, Apr., 1994, pp. 426–431.

Fujii, et al., "A 50–µA Standby 1Mx1/256Kx4 CMOS DRAM with High–Speed Sense Amplifier," IEEE Jnl of Solid State Circuits, vol. SC–21, No. 5, Oct., 1986, pp. 643–647.

Yamashita, Koichi and Shohei Ikehara, "A Design and Yield Evaluation Technique for Wafer–Scale Memory," IEEE Trans Jnl, Apr. 1992, pp. 19–27.

(List continued on next page.)

*Primary Examiner*—Brian Dutton
*Attorney, Agent, or Firm*—Skjerven, Morrill, MacPherson, Franklin & Friel LLP

[57] ABSTRACT

A system and method for wafer scale integration optimized for medium die size integrated circuits by interconnecting a large number of separate memory (or other circuit) modules on a semiconductor wafer so as to electrically exclude both defective modules and defective interconnect/power segments, and include operative modules and interconnect/power segments. A set of discretionary connections are associated with each of the separate modules and interconnect/power segments and such connections are made (or broken) after a module or interconnect or power segment is tested. A power supply network is set up by combining operative power segments. A bidirectional bus is set up by combining operative interconnect segments to connect to each operative modules. This bidirectional bus consists of one or more hierarchies for speed, power and yield considerations. Each module is assigned an identity code using discretionary connections.

10 Claims, 21 Drawing Sheets

U.S. PATENT DOCUMENTS

| | | | |
|---|---|---|---|
| 3,761,879 | 9/1973 | Brandsma et al. | 340/172.5 |
| 3,803,562 | 4/1974 | Hunter | 340/173 R |
| 3,810,301 | 5/1974 | Cook | 29/593 |
| 3,835,530 | 9/1974 | Kilby | 29/574 |
| 3,849,842 | 11/1974 | Hubacher | 29/574 |
| 3,983,537 | 9/1976 | Parsons et al. | 340/172.5 |
| 4,007,452 | 2/1977 | Hoff, Jr. | 340/173 R |
| 4,038,648 | 7/1977 | Chesley | 340/173 R |
| 4,063,225 | 12/1977 | Stewart | 365/156 |
| 4,071,887 | 1/1978 | Daly et al. | 364/200 |
| 4,092,733 | 5/1978 | Coontz et al. | 365/200 |
| 4,132,869 | 1/1979 | Knox | 179/38 |
| 4,188,670 | 2/1980 | Hsia | 365/49 |
| 4,215,430 | 7/1980 | Johnson, Jr. | 375/111 |
| 4,227,045 | 10/1980 | Chelcun et al. | 176/66.1 |
| 4,319,356 | 3/1982 | Kocol et al. | 371/38 |
| 4,329,685 | 5/1982 | Mahon et al. | 340/825.84 |
| 4,355,387 | 10/1982 | Portejoie et al. | 370/102 |
| 4,379,327 | 4/1983 | Tietjen et al. | 364/200 |
| 4,400,794 | 8/1983 | Koos | 364/900 |
| 4,407,014 | 9/1983 | Holtey et al. | 364/200 |
| 4,414,480 | 11/1983 | Zasio | 307/443 |
| 4,438,352 | 3/1984 | Mardkha | 307/475 |
| 4,458,297 | 7/1984 | Stopper et al. | 361/403 |
| 4,467,400 | 8/1984 | Stopper | 361/403 |
| 4,494,196 | 1/1985 | Greer | 364/200 |
| 4,605,928 | 8/1986 | Georgiou | 340/825.94 |
| 4,615,017 | 9/1986 | Finlay et al. | 364/900 |
| 4,627,058 | 12/1986 | Moriyama | 371/37 |
| 4,630,355 | 12/1986 | Johnson | 29/575 |
| 4,637,073 | 1/1987 | Selin et al. | 455/78 |
| 4,639,861 | 1/1987 | Appiano et al. | 364/200 |
| 4,639,933 | 1/1987 | Howell et al. | 375/8 |
| 4,646,298 | 2/1987 | Laws et al. | 371/16 |
| 4,649,384 | 3/1987 | Sheafor et al. | 340/825.03 |
| 4,653,050 | 3/1987 | Vaillancourt | 371/10 |
| 4,663,758 | 5/1987 | Lambarelli et al. | 370/94 |
| 4,667,328 | 5/1987 | Imran | 371/61 |
| 4,680,780 | 7/1987 | Agoston et al. | 375/120 |
| 4,703,436 | 10/1987 | Varshney | 364/490 |
| 4,707,808 | 11/1987 | Heimbigner | 365/182 |
| 4,719,621 | 1/1988 | May | 370/85 |
| 4,736,365 | 4/1988 | Stern | 370/85 |
| 4,748,588 | 5/1988 | Norman et al. | 364/900 |
| 4,769,789 | 9/1988 | Noguchi et al. | 365/189.05 |
| 4,785,415 | 11/1988 | Karlquist | 364/900 |
| 4,823,363 | 4/1989 | Yoshida | 375/120 |
| 4,847,615 | 7/1989 | McDonald | 340/825.02 |
| 4,855,613 | 8/1989 | Yamada et al. | 307/202.1 |
| 4,860,285 | 8/1989 | Miller et al. | 370/100 |
| 4,864,496 | 9/1989 | Triolo et al. | 364/200 |
| 4,866,508 | 9/1989 | Eichelberger et al. | 357/74 |
| 4,872,137 | 10/1989 | Jennings, III | 364/900 |
| 4,876,700 | 10/1989 | Grindahl | 375/87 |
| 4,881,232 | 11/1989 | Sako et al. | 371/37.4 |
| 4,884,122 | 11/1989 | Eichelberger et al. | 357/71 |
| 4,890,224 | 12/1989 | Fremont | 364/200 |
| 4,897,818 | 1/1990 | Redwine et al. | 365/221 |
| 4,906,987 | 3/1990 | Venaleck et al. | 340/825 |
| 4,907,062 | 3/1990 | Fukushima | 375/75 |
| 4,912,633 | 3/1990 | Schweizer et al. | 364/200 |
| 4,926,382 | 5/1990 | Sakui et al. | 365/203 |
| 4,937,203 | 6/1990 | Eichelberger et al. | 437/51 |
| 4,943,914 | 7/1990 | Kubo | 364/200 |
| 4,943,966 | 7/1990 | Giunta et al. | 371/11.1 |
| 4,955,020 | 9/1990 | Stone et al. | 370/85.9 |
| 4,970,724 | 11/1990 | Yung | 371/9.1 |
| 4,974,048 | 11/1990 | Chakravorty et al. | 357/40 |
| 4,980,765 | 12/1990 | Kudo et al. | 358/160 |
| 4,984,192 | 1/1991 | Flynn | 364/900 |
| 4,985,895 | 1/1991 | Pelkey | 371/37.7 |
| 5,001,712 | 3/1991 | Splett et al. | 371/3 |
| 5,003,558 | 3/1991 | Gregg | 375/108 |
| 5,020,020 | 5/1991 | Pomfret et al. | 364/900 |
| 5,021,985 | 6/1991 | Hu et al. | 364/748 |
| 5,043,820 | 8/1991 | Wyles et al. | 358/213.28 |
| 5,045,725 | 9/1991 | Sasaki et al. | 307/465 |
| 5,055,897 | 10/1991 | Canepa et al. | 357/23.5 |
| 5,077,596 | 12/1991 | Inoue | 357/41 |
| 5,077,737 | 12/1991 | Leger et al. | 371/10.1 |
| 5,077,738 | 12/1991 | Larsen et al. | 371/15.1 |
| 5,103,424 | 4/1992 | Wade | 365/200 |
| 5,111,271 | 5/1992 | Hatada et al. | 357/45 |
| 5,111,434 | 5/1992 | Cho | 365/207 |
| 5,118,975 | 6/1992 | Hillis et al. | 307/602 |
| 5,125,006 | 6/1992 | Marinaro | 375/7 |
| 5,128,737 | 7/1992 | van der Have | 357/40 |
| 5,131,015 | 7/1992 | Benjaram et al. | 375/121 |
| 5,133,064 | 7/1992 | Hotta et al. | 395/550 |
| 5,159,273 | 10/1992 | Wright et al. | 324/537 |
| 5,161,152 | 11/1992 | Czerwiec et al. | 370/84 |
| 5,187,779 | 2/1993 | Jeddeloh et al. | 395/325 |
| 5,204,836 | 4/1993 | Reed | 365/200 |
| 5,206,832 | 4/1993 | Yamaguchi et al. | 365/230.02 |
| 5,214,657 | 5/1993 | Farnworth et al. | 371/40.1 |
| 5,218,686 | 6/1993 | Thayer | 395/425 |
| 5,227,677 | 7/1993 | Furman | 307/443 |
| 5,243,623 | 9/1993 | Murdock | 375/7 |
| 5,243,703 | 9/1993 | Farmwald et al. | 395/325 |
| 5,247,522 | 9/1993 | Reiff | 371/29.5 |
| 5,252,507 | 10/1993 | Hively et al. | 437/51 |
| 5,254,883 | 10/1993 | Horowitz et al. | 307/443 |
| 5,261,077 | 11/1993 | Duval et al. | 395/500 |
| 5,265,216 | 11/1993 | Murphy et al. | 395/325 |
| 5,268,639 | 12/1993 | Gasbarro et al. | 324/158 R |
| 5,278,967 | 1/1994 | Curran | 395/425 |
| 5,311,083 | 5/1994 | Wanlass | 307/475 |
| 5,329,174 | 7/1994 | Chiang | 307/443 |
| 5,329,559 | 7/1994 | Wong et al. | 375/119 |
| 5,371,420 | 12/1994 | Nakao | 326/27 |
| 5,379,258 | 1/1995 | Murakami et al. | 365/200 |
| 5,402,388 | 3/1995 | Wojcicki et al. | 365/233 |
| 5,434,996 | 7/1995 | Bell | 395/550 |

OTHER PUBLICATIONS

Horst, Robert W., "Task–Flow Architecture for WSI Parallel Processing," IEEE Trans Jnl, Apr., 1992, pp. 10–18.

Rhodes et al., "A Monolithic Hough Transform Processor Based on Restructurable VLSI," IEE Trans. on Pattern Analysis and Machine Intelligence, vol. 1, Jan., 1991, pp. 106–110.

Ganapathy et al., "Yield Optimization in Large RAM's with Hierachical Redundancy," IEEE Jnl of Solid–State Circuits, vol. 26, No. 9, Sep., 1991, pp. 1259–1269.

Aubusson, Russell C. and Ivor Catt, "Wafer–Scale Integration—A Fault–Tolerant Procedure," IEE Jnl of Solid State Circuits, vol. SC–13, No. 3, Jun., 1978, pp. 339–344.

Stodieck, Robert, "Designing With the IDT49C460 and IDT39C60 Error Detection and Correction Units," Application Note AN–24 by IDT, 1989, pp. 1–10.

Antola et al., "Reconfiguration of Binary Trees: The Flow–Driven Approach," 1991 International Conference on Wafer Scale Integration, 1991, pp. 141–147.

Shi, Weiping and W. Kent Fuchs, "Large Area Defect–Tolerant Tree Architectures," 1991 International Conference on Wafer Scale Integration, 1991, pp. 127–133.

IBM Technical Disclosure Bulletin, vol. 32, No. 5A, Oct. 1989, New York, pp. 423–425.

IBM Technical Disclosure Bulletin, vol. 32, No. 9A, Feb. 1990, New York, pp. 405–406.

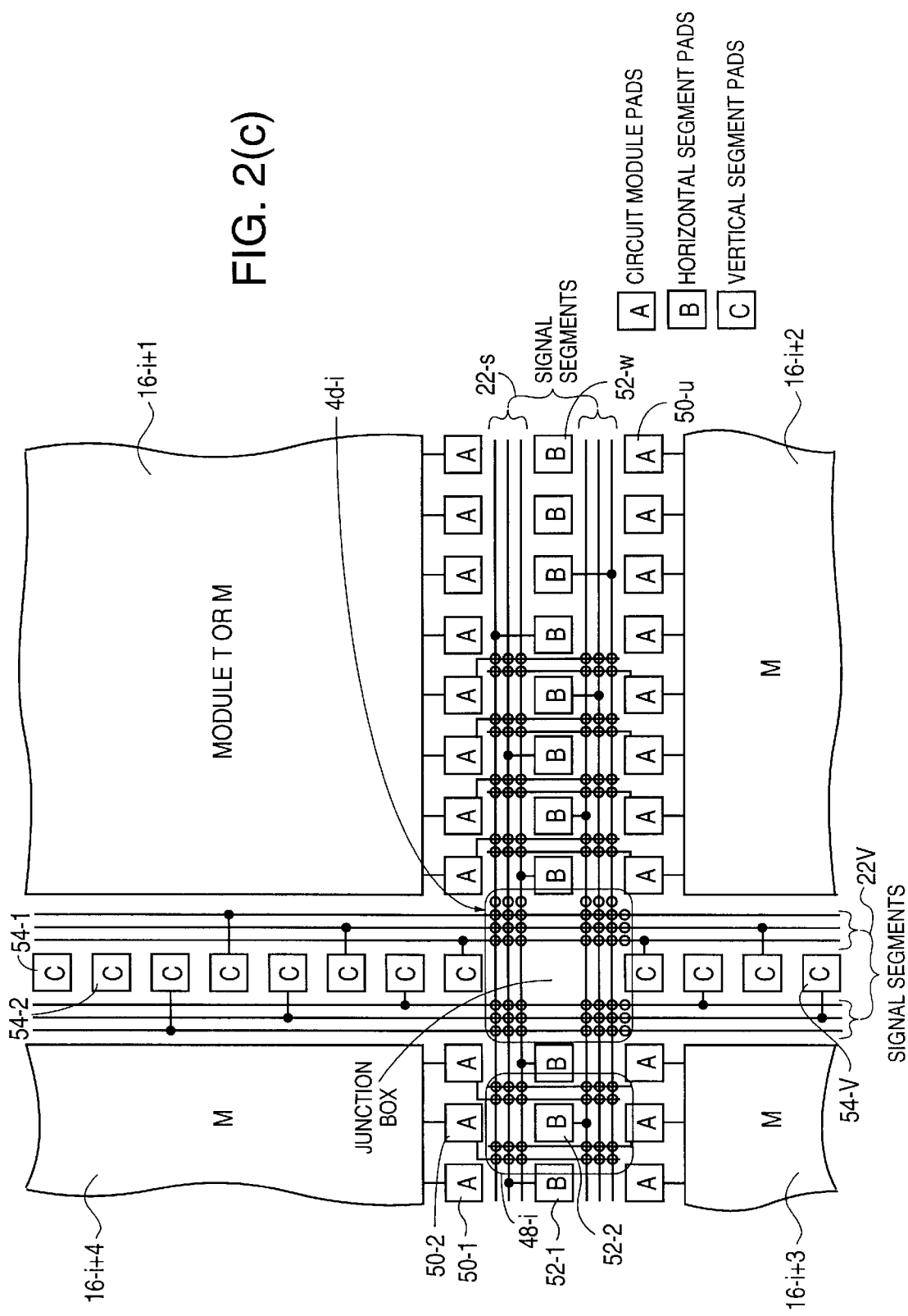

CIRCUIT MODULE REDUNDANCY ARCHITECTURE PROCESS

CROSS-REFERENCE TO RELATED APPLICATION

This application is a division of application Ser. No. 08/553,217, filed Nov. 7, 1995, now abandoned, which is a division application of Ser. No. 08/246,396 filed on May 20, 1994, now U.S. Pat. No. 5,498,836 which is a continuation of U.S. Ser. No. 07/865,410 filed on Apr. 8, 1992, now abandoned which is a continuation-in-part of U.S. Ser. No. 07/787,984 filed on Nov. 5, 1991, now abandoned.

BACKGROUND OF THE INVENTION

1. Field of the Invention

The present invention relates to a wafer scale integration semiconductor device comprising a plurality of semiconductor circuit modules all integrated on an entire wafer or a fraction of a wafer and more particularly, to the architectures and methods to enable the economical implementation of a wafer-scale integrated circuit with high performance.

More specifically, this invention relates to a wafer-scale-integration system including (1) a novel configurable-interconnect architecture, (2) a novel high-speed parallel on-wafer bus system, (3) a unique layout that allows testing and configuration using simple probes, (4) a special coding method for establishing unique addresses for each circuit module, (5) a novel power supply switch, and (6) unique algorithms for configuring full-wafer or partial-wafer circuits.

2. Description of the Prior Art

In the fabrication of integrated circuits, a plurality of identical circuits such as memory cells are simultaneously fabricated on a wafer. The wafer is then broken along scribe lines into a plurality of dice or chips which are separately tested and packaged. Typically, yields from a given wafer are less than 100% since many of the chips are discarded. The wafer surface area is not used economically since substantial area is needed for scribe lines and bonding pads. The cost associated with the packaging of the individual chips represents a substantial portion of the total costs of the end products, and the "footprint" of a packaged chip is substantially larger than the chip itself. Furthermore, as the level of integration increases, the fabrication of progressively larger chips results in progressively lower yields at the same defect density. Many attempts have been made in the prior art to utilize the useful or operative circuits on a wafer while bypassing the inoperative circuits without physically separating the chips. See, for example N. MacDonald et al, "200 Mb Wafer Memory," IEEE 1989 ISSCC Technical Digest, pp.240–241; P. J. Cavill et al, "Wafer-scale integration" Microelectronics Manufacturing Technology, pp. 55–59, May 1991; U.S. Pat. No. 4,007,452 to M. E. Hoff, Jr., "Wafer Scale Integration System"; and U.S. Pat No. 4,038, 648 to G. D. Chesley, "Self-Configurable Circuit Structure for Achieving Wafer Scale Integration. Alternative multi-chip-module approaches are also known that can approximate the high circuit density and high speed performance of true wafer scale integration. See, for example U.S. Pat. No. 4,866,501 "Wafer Scale Integration"; U.S. Pat. Nos. 4,884, 122 and 4,937,203 "Method and Configuration for Testing Electronic Circuits and Integrated Circuit Chips Using a Removable Overlay Layer"; U.S. Pat. No. 4,907,062 "Semiconductor Wafer-Scale Integrated Device Composed of Interconnected Multiple Chips Each Having an Integration Circuit Chip . . . ". These approaches, however, do not address the yield and cost issues and are very expensive.

Generally, the operative circuits or devices on a wafer are electrically isolated from the inoperative devices through the use of one or more discretionary connections. These discretionary connections can be made using masks, fuses or fusible links. See, for example, U.S. Pat. Nos. 3,835,530 and 3,810,301. Special serial identify bus and circuitry was developed to address and operate operative modules with a relative connection method. This approach, like most other prior art approaches, assumes that the bus itself and its associated incremented circuitry are defect-free. In reality, however, as the buses traverse through the entire wafer, there is fairly high probability that there will be at least one defect that would render the whole wafer useless. Similarly, any defect in the power distribution buses, either open or short circuits, would have rendered useless the whole wafer or a significant portion of it. See, for example H. Stopper, "Wafer-Scale Integration", pp. 354–364, Electronic Material Handbook, ASM 1989. To minimize the defect and its impact on the buses themselves, one recent approach (MacDonald, cited above) relied on minimizing the number of wires in the bus and routed the bus in a spiral serial fashion through the wafer. This has the advantage of confining the impact of defect on the bus itself. Its serial nature, however, greatly limited performance as the data from any module must traverse through the spiral path to get to the outside.

SUMMARY OF THE INVENTION

In accordance with the invention, a plurality of circuit modules are formed on a wafer grouped into blocks and arranged on a rectangular grid. An interconnect network including signal lines and power lines with built-in redundancy surrounds each block. Both each module and each segment of the interconnect network are tested, and then the defect-free segments of the interconnect network are connected together by fusible links to the usable circuit modules.

Thus the present invention provides a wafer-scale integration device that has:

(1) a highly-redundant, configurable, segmented interconnection network that supports high-speed parallel bus architectures with very high yield;

(2) a configurable, segmented power supply network that minimizes yield loss due to power line defects;

(3) special power supply switch circuitry residing in the circuit modules that isolates defective modules with low power dissipation;

(4) a high-speed parallel bus architecture with special transceiver and repeater circuitry;

(5) special coding sequences for establishing unique addresses for the circuit modules;

(6) a special layout arrangement that allows easy probing and configuration; and (7) special configuration algorithms that can configure either full or fractional wafers.

The combination of these elements allows the economical implementation of a high performance, low power, highly integrated semiconductor device on either an entire or fractional monolithic wafer with one or more types of circuit modules.

The present invention in one embodiment includes a segmented interconnection and power distribution network that is highly fault-tolerant and, upon configuration, establishes a high-speed parallel bus system connecting to all operative circuit modules on a wafer or part of a wafer. Each circuit module can be a memory circuit (DRAM, SRAM, EPROM, EEPROM, Flash EPROM or other types of memory), a logic circuit (microprocessor, microcontroller, floating point processor, DSP processor or other co-processor, programmable logic, field-programmable gate-array, glue logic or other types of logic) or a combination of memory and logic circuitry.

For the wafer-scale or fractional-wafer or large die size integrated circuit, defect management or redundancy circuit as described above is one of the more critical parameters in ensuring reasonable and high yield and thereby lower cost. The above describes redundancy architecture and techniques for very large chip with efficient defect management that overcome the limitations of conventional redundancy circuits.

One embodiment of the redundancy architecture is particularly suitable for medium die size integrated circuits (chip size smaller than 2–3 square inches). This embodiment, the chip includes one or more circuit blocks with each circuit block including a plurality of circuit modules. At least one redundant circuit module is in one of the circuit blocks that can be used to replace another circuit module in one of the circuit blocks. The redundant circuit module as well as the circuit modules than can be replaced by the redundant circuit module each include an identification circuit whereby each of these circuit modules can be selected by matching their unique identification code (which is part of the address) with the address signals sent to each of these circuit modules. This memory-mapped addressing method is different from conventional fully-decoded memory implementations which do not permit efficient circuit module replacement, and is different from the prior art method of using a separate serial identification bus (as in U.S. Pat. No. 4,007,452) which incurs area and performance penalties. The redundant circuit module has a programmable identification code that can be implemented using fuses, antifuses, EPROM, EEPROM, flash EPROM cells or other programmable switches. The circuit modules that can be replaced by the redundant circuit module have either preset, decoded or programmable identification codes; they also include a disable switch that can be activated when the particular circuit module is defective and is to be replaced. The disable switch may be implemented using fuses, antifuses, EPROM, EEPROM, flash EPROM cells or other programmable switches. The redundant circuit module and these other circuit modules may be identical for more regular implementation. Also, the address, data and control signals may be distributed using any of the conventional methods or the high-speed bus described in the main application. This embodiment allows efficient circuit module-level replacement redundancy for much improved chip yield over conventional redundancy architectures that only provide redundancy replacement capability to defects within the memory array area which is typically only about 50% of the chip area.

BRIEF DESCRIPTION OF THE DRAWINGS

FIG. 2 is a schematic view of a portion of the wafer-scale integration device showing the segmentation of the interconnection network.

FIG. 2(c) shows the detailed layout arrangement for the probe pads for easy and complete testing.

DESCRIPTION OF THE PREFERRED EMBODIMENTS

Figure 1:
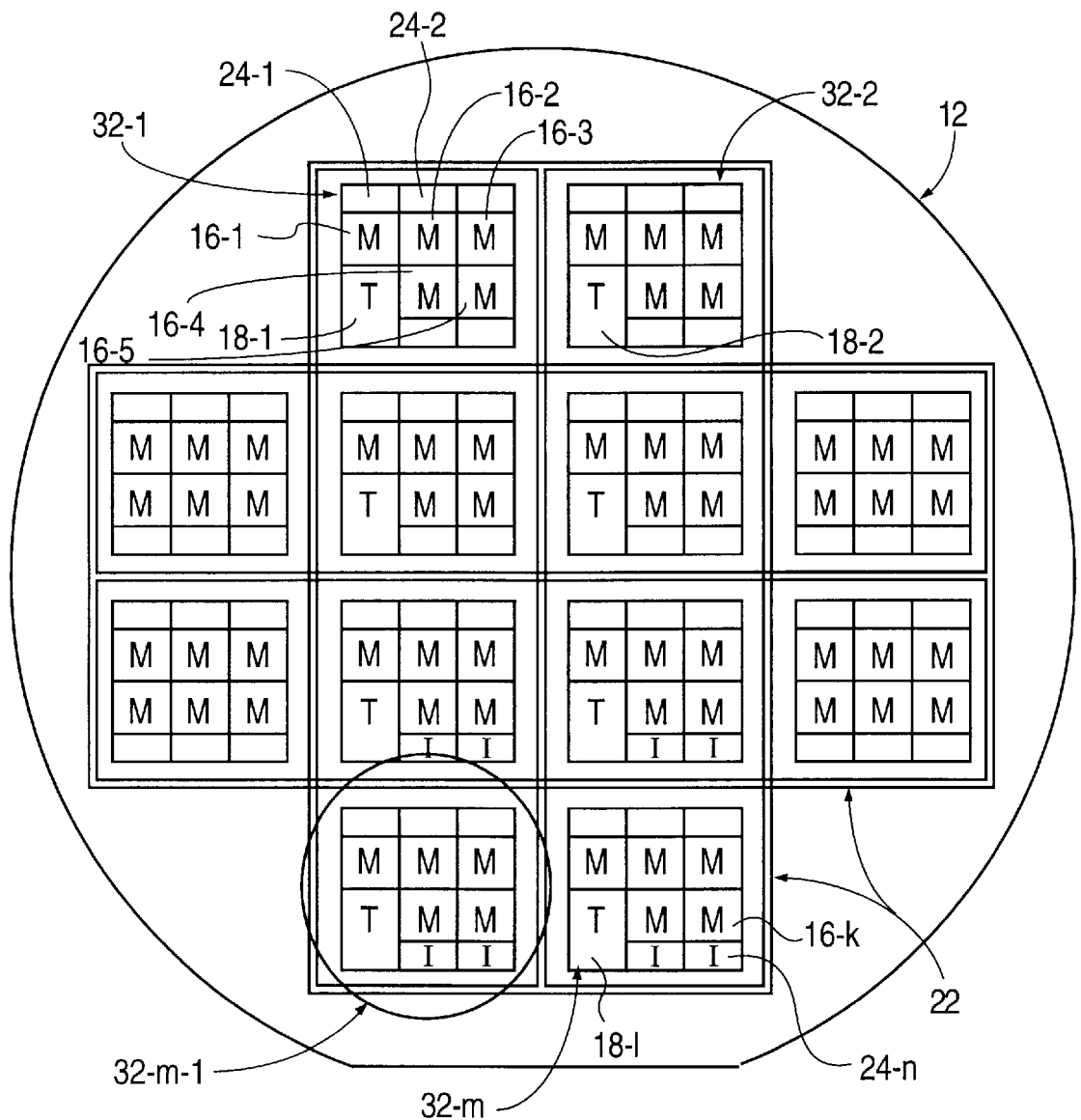
FIG. 1 is a schematic plan view of a wafer-scale integration semiconductor device embodiment comprising a plurality of semiconductor circuit chips all formed on one wafer, with VCC, VSS power supply interconnections and signal bus interconnections.
Figure 1:
Figure 1:
Figure 2A:
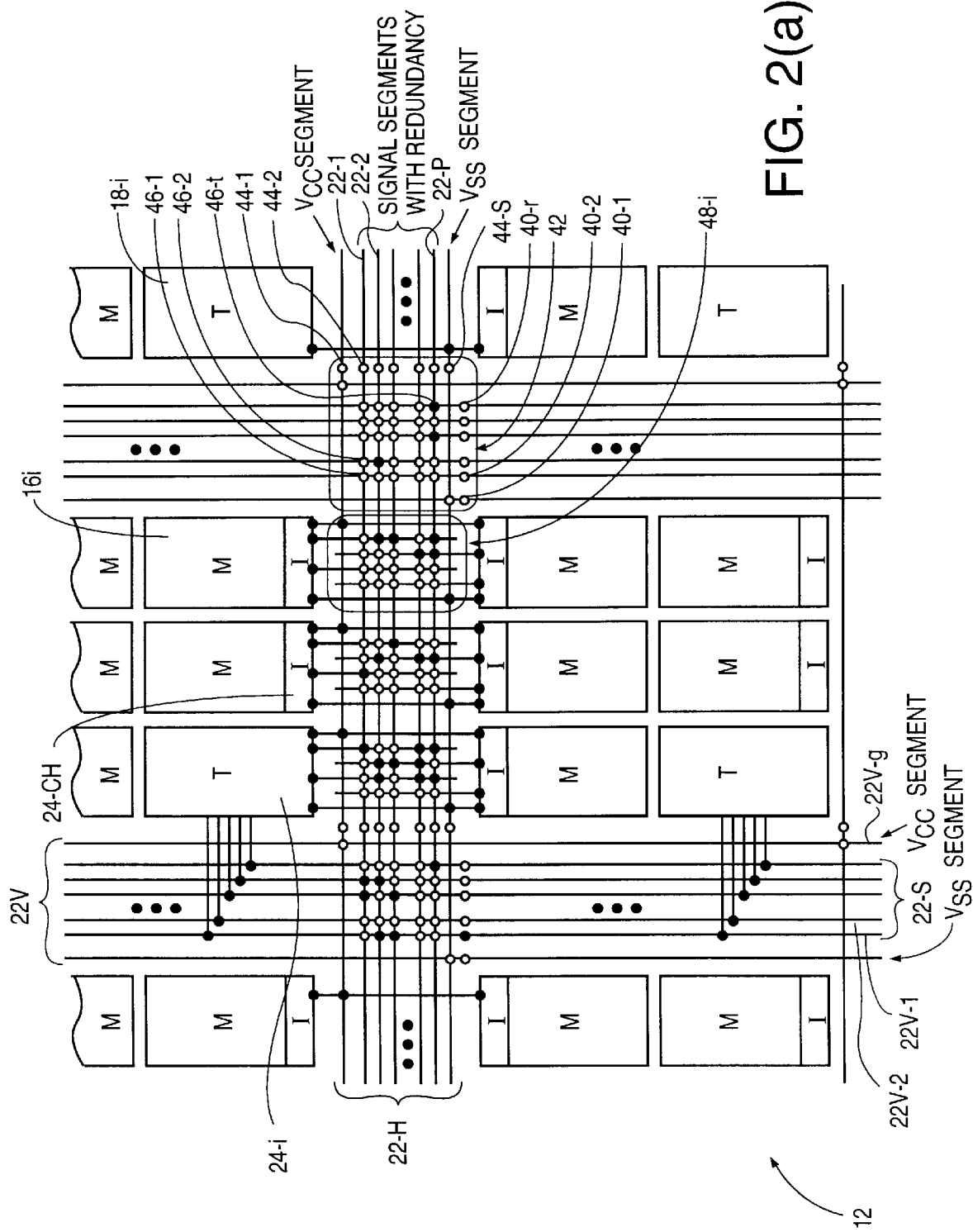
FIG. 2(a) shows the interconnect segments with their junction boxes and module interface boxes.
Figure 2B:
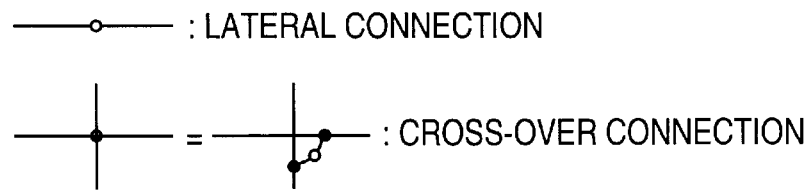
FIG. 2(b) shows two-dimensional routing using the segmented interconnect system.
Figure 2B:
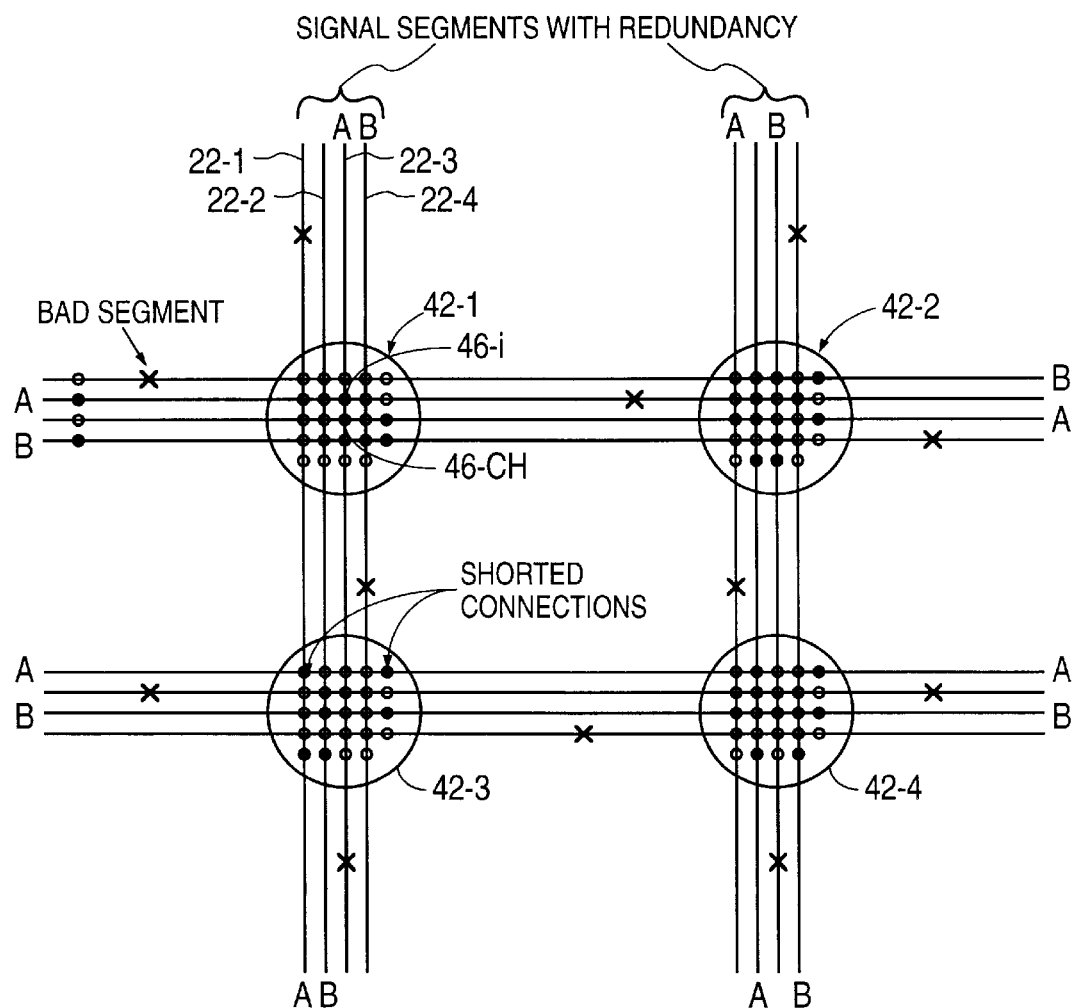
Figure 2D:
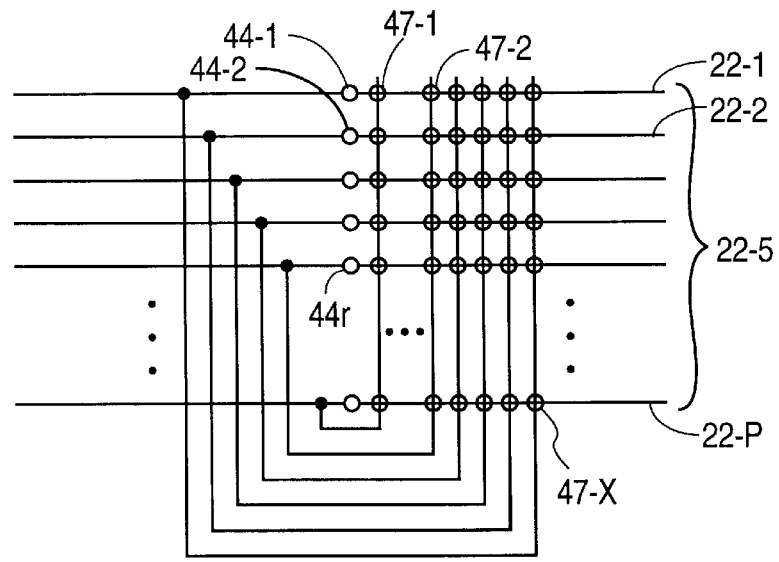
FIG. 2(d) and 2(e) show alternative arrangements for connecting lateral segments (vertical or horizontal) with the ability to change wire locations between neighboring segments.
Figure 2E:
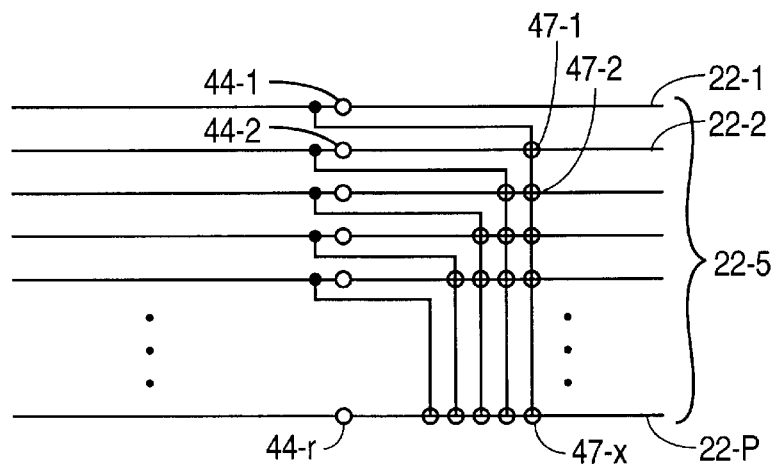
Figure 2F:
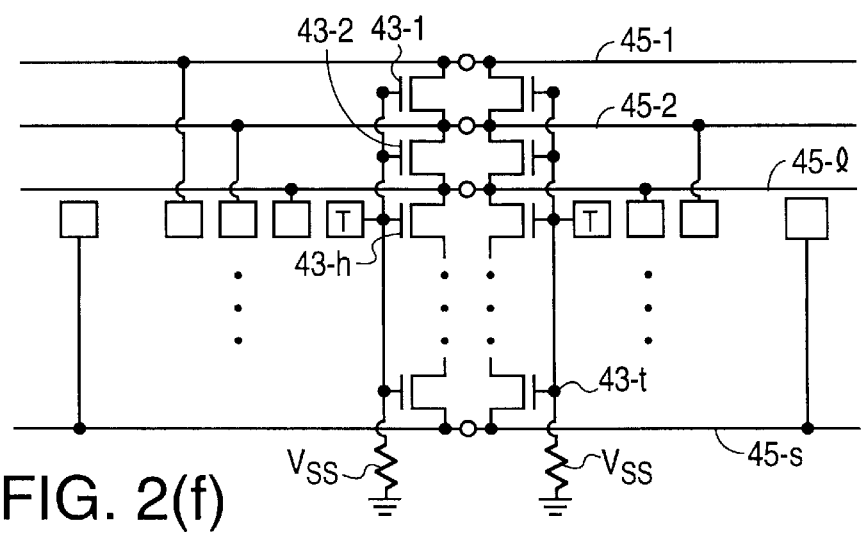
FIG. 2(f) is an arrangement of test transistors for testing open defects in the interconnect segment.

FIG. 1 is a schematic plan view showing a semiconductor wafer 12 having formed on its surface a plurality of circuit chip modules 16-1, 16-2, . . . , 16-i, . . . , 16-k each designated "M" and transceiver/repeater modules 18-1, 18-2, . . . , 18-i, . . . , 18l each designated "T". Surrounding the modules 16-1, 16-2, . . . 16k, and 18-1, . . . , 18-l is the interconnect network 22 that includes power supply and signal buses (not shown). Each circuit chip module 16-i has an associated module/bus interface section 24-1, 24-2, . . . , 24-i, . . . 24-n each designated "I" that can be connected to the interconnect network 22. The interface section 24-i may also include power supply switch circuit. The transceiver/repeater module 18-i (designated T) contains the circuitry that is part of the parallel bus architecture. Although each shown to be the same and of equal size in Fig. 1, the circuit chip modules 16-i designated "M" may consist one of more types of modules (such as DRAM module, SRAM module, MPR module, or logic module) of varying sizes.

The size and location of transceiver/repeater modules 18-i designated "T" shown in FIG. 1 is shown schematically only. Physically, each of the transceiver/repeater module may be located in one cluster or distributed along and being part of the interconnect network. The interconnect network may either go around or go through the circuit blocks partially or fully.

The layout arrangement, however, is preferred to have a regular grid pattern as shown in the main interconnect network 22 between module blocks 32-1, 32-2, ... 32-i, ..., 32-m, (a cluster of modules 16-1, 16-2, 16-3, 16-4, 16-5, 18-1, surrounded by the interconnect network 22) to allow easy test probing and configuration. Each module block 32-i may contain from one to a hundred modules 16-1, 16-2, ..., 16-i, ..., 18-1, and each wafer may contain from several to hundreds of module blocks 32-1 ..., 32-m. Although all the modules on the wafer 12 can be connected together to form a single device (a full-wafer device), the wafer 12 can also be scribed into pieces along predefined scribe streets (not shown) and/or along the interconnect buses (not shown) to form devices containing one or more full or partial module blocks 32-1, ... , 32-m (and hence a fractional-wafer device). Although not shown in FIG. 1, the connection from the full-wafer or fractional-wafer device to the outside can be accessed through bonding pads around the perimeter of the wafer or pads within the interconnect network, or pads inside the transceiver/receiver module (T) using wire-bonding, TAB (tape-automated bonding) or other wiring means.

Interconnect System

FIG. 2(*a*) shows an enlarged section of the wafer 12 of FIG. 1 with the details of the segmented interconnect network 22. Each horizontal interconnect segment 22-H includes a VCC line, a VSS line, and a plurality-of signal segments 22S each including lines 22-1, 22-2, ..., 22-i, ..., 22-p. Similarly, each vertical interconnect segment 22-V similarly has a VCC line, a VSS line, and a plurality of signal segments 22V-1, 22V-2, ..., 22V-i, ..., 22V-q. The number of the signal segments 22-1, ..., 22-P or 22V-1, ..., 22V-q is the sum of the number of signals needed by the bus architecture and the number of additional redundant wires for better segment yield. There can be vertical and horizontal interconnect segments. Interconnect segments that run in the same direction can be joined at lateral connection points 40-1, 40-2, ... , 40-i, ... , 40-r by an antifuse which is normally open but can be short-circuited through laser beam, electrical. pulses, or other energy application methods.

Multiple interconnect segments are joined at the interconnect junction box 42 inside of which there is only one set of lateral connection points 44-1, 44-2, ..., 44-i, ..., 44-i, ..., 44-s and 40-1, 40-2, ... 40-i, ..., 40-r along respectively each of the horizontal and vertical directions. Between the horizontal and the vertical segments, there are cross-over connection points 46-1, 46-2, ..., 46-i, ..., 46-t between signal segments, again constructed using antifuses in one embodiment. The cross-over connection points 46-1, ..., 46-t between the signal segments and the power supply segments from the perpendicular interconnect segments can be either fully or partially populated. This specific arrangement of the junction box 42 is useful, because it allows electrical isolation between segments, while at the same time allowing full electrical testing for defects (particularly, shorting defects) between any neighboring wiring segments, thereby allowing efficient and high-yield interconnection routing and configurations. As shown in FIG. 2(*a*), each module 16-i can be connected to the interconnect segment 22-p through a module interface box 48-i which has a combination of hard-wired connections and cross-over connection points. FIG. 2(*a*)-1 shows how lateral connection points and cross-over connection points are designated in FIG. 2(*a*).

FIG. 2(*b*) shows a configuration example using the interconnect segments 22 and junction boxes 42-1, 42-2, ..., 42-4 described above. In this example, four wires 22-1, 22-2, ... , 22-4 per segment 22S are used to configure a signal bus of two wires (A and B). The faulty wires such as 22-1 are marked "X" and connected (shorted) connection points 46-i, 46-i+1 are marked by solid filled-in dots. Note that the sequence and location of the bus signals (A and B) does not matter as they will be connected to the correct input/output pins of the circuit modules (not shown) through the module interface boxes 48-i. Generally, to successfully configure an interconnect segment, the number of redundant signal segments in an interconnect segment is equal to or more than the total number of faulty segments of two neighboring interconnect segments minus the number of faulty segments that happen to line up between the neighboring interconnect segments.

FIG. 2(*c*) shows a more detailed layout of the interconnect segments 22V, 22S and the circuit modules 16-i, 16-i+1, 16-i+3, 16-i+2. Three sets of probe pads are shown: pads 50-1, 50-2, ... , 50-i, ... , 50-u for the circuit modules (designated A), pads 52-1, 52-2, ... 52-i, ... , 52-w for the horizontal interconnect segments (designated B), and pads 54-1, 54-2, ... 54-1, ... , 54-v for the vertical interconnect segments (designated C). Partial interconnect junction box 42-i and module interface boxes 48-i are also shown. Each signal segment 22V, 22S is directly accessible from a probe pad 52-1, 54-1, etc. (pad marked B or C). Although the power supply segments are not shown, they are similarly accessible from the probe pads 50-1, 52-1, 54-1, etc. This arrangement is useful because it allows each wiring segment to be tested for shorts with respect to all its possible neighboring wire segments.

In a parallel bus architecture, any shorts in the bus signal line (the power supply is also an inherent parallel bus system) will render the whole device non-functional and therefore shorts are highly destructive and their occurrence must be minimized. The highly regular arrangement of the probe pads, particularly the pads 52-1, 52-w, and 54-1, ..., 54-v for the interconnect segments (marked B and C), allows easy access using conventional test probes or probe cards on conventional probing stations. Note that although the pad groups A, B and C are shown in FIG. 2(*c*) to be in one column and three rows, they can be arranged to form one to three columns and/or one to three rows depending on the number of pads required by the particular circuit being implemented. For a typical testing and configuration session, a first probe card (not shown) is used to test the circuit modules 16-i, 16-i+2, 16-i+3 and transceiver/repeater modules 16-i+1, a second probe card (not shown) is used to test all the interconnect segments, a computer then calculates and generates a routing map to set up an operative interconnect and power supply network and all the operative modules. The configuration of the selected connection points (antifuses) is then programmed using either laser beam, electrical or other energy means.

FIG. 2(*d*) shows a variation of the lateral junction box of FIG. 2(*b*) which allows the neighboring segments 22-1, 22-2, ... , 22-p to be connected laterally either directly or to a segment at different location through using a cross-connection point 47-1, 47-2, . . . , 47-x. Again, every segment in this lateral junction box can be connected to a probe pad (not shown) to allow for complete testing before configuration. The lateral connection points 44-1, 44-2, . . . , 44-r here are actually redundant and can be left out (leaving an open circuit there).

The cross-connection points 47-1, 47-2, . . . , 47-x do not need to be fully populated, to allow for easier layout and/or ensure reduced parasitic capacitance. FIG. 2(*e*) shows one such example with half-populated cross-connection points 47-1, 47-2, . . . , 47-x. In fact, within each interconnect segment 22-S, the wire segments 22-1, 22-1, . . . , 22-p can be divided into two or more groups so that within each group the cross-connection points can be fully, half or partially populated to tradeoff wiring flexibility versus parasitic reduction.

To allow for iterative configuration as well as for further reducing the impact of non-detected defects, additional fuses (which are normally connected, and can be programmed open by laser beam, for example) can be inserted in the signal segments and/or the power supply segments.

The two-dimensional segmented interconnect system described above is highly fault-tolerant. Any shorting defect can be avoided by using alternative redundant segment. If all the wiring resources are insufficient or not usable in a particular segment, the segment can be isolated with minimum yield loss (so that only those modules attached to the segment will be lost) without affecting the rest of the device. The interconnect system is particularly fault-tolerant with respect to open defects, because any interconnect segment can be reached from both its ends. The power supply network, similarly arranged in the segmented fashion, is also highly fault-tolerant.

FIG. 2(*f*) shows the arrangement of test transistors for testing open defects in the interconnect segment. As shown in the figure, n-channel transistors 43-1, 43-2, . . . , 43-k, . . . , 43-t are placed between wires 45-1, 45-2, . . . , 45-e, . . . , 45-s, near the end of the interconnect segment with their common gates tied to VSS. During interconnect open-defect testing, the transistor gates are turned-on thereby connecting the ends of these wires. Any open defect can be detected and located by noting the discontinuity between pads of neighboring wires 45-1, 45-2. Similar arrangements can be implemented using p-channel transistors or other active devices.

The power supply network, shown above in FIG. 2(*a*) as side-by-side with the signal segments, in actual layout may be placed away from the signal segments, and in circuits with high power dissipation may be located on a separate metal layer or layers.

Power Supply Switch Circuitry

Figure 3A:
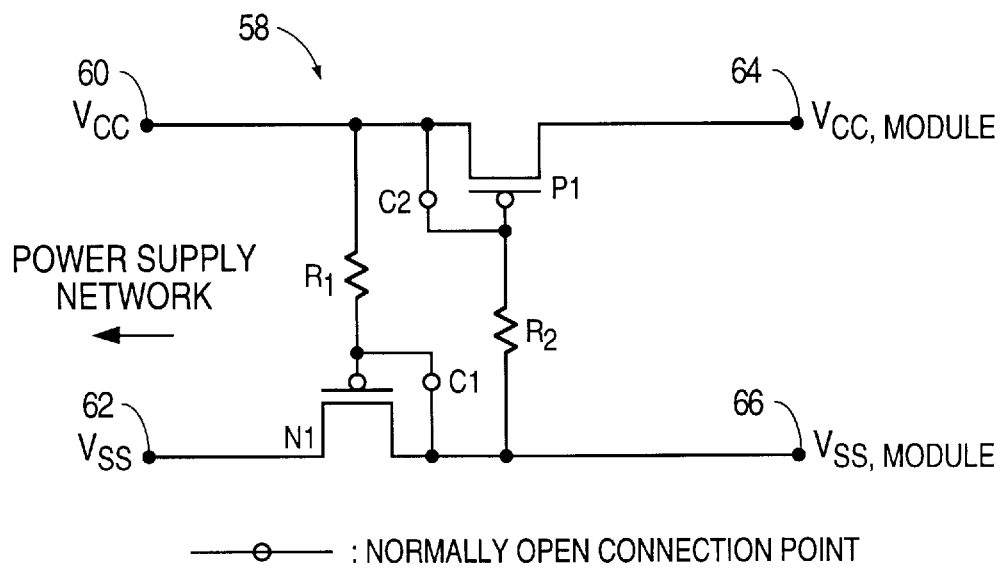
FIG. 3(a) is a schematic diagram of the power supply switch.
Figure 3B:
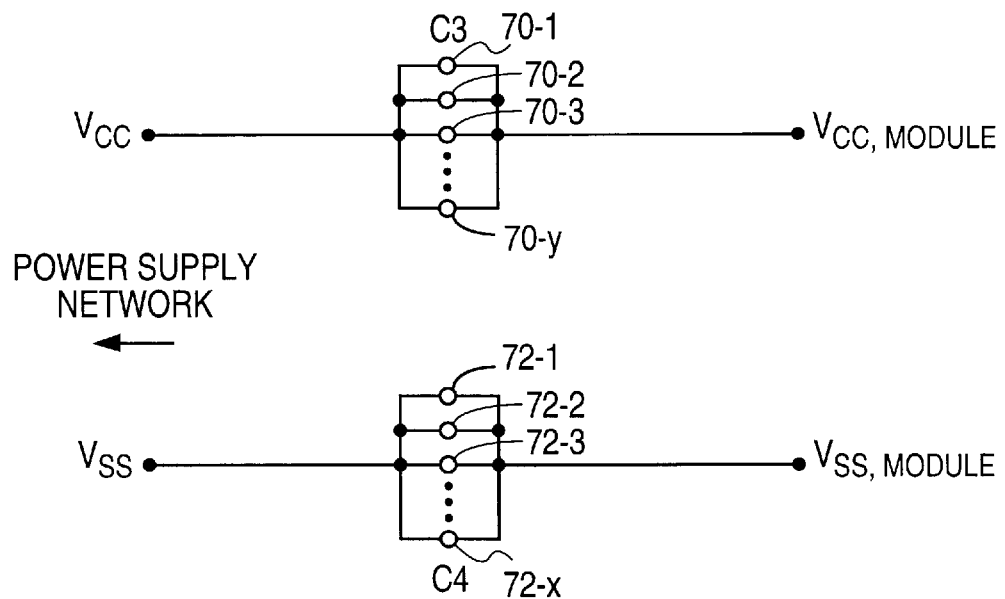
FIG. 3(b) is a direct-connect power supply switch.

Further power supply fault-tolerance is accomplished through the isolation of individual modules with power line shorts. FIG. 3(*a*) shows a schematic diagram of the power supply switch 58 residing in each circuit module. The VCC node 60 and VSS node 62 are connected to the associated power supply segment outside the module, while VCCM node 64 and VSSM node 64 are connected to the internal power supply of the module. Connection points C1 and C2 are normally open (antifuses), and R1 and R2 are high value resistors that respectively bias the gates of n-channel transistor N1 and p-channel transistor P1 to keep each transistor fully turned-on. When there is short or high leakage current inside a particular module, transistors N1 and P1 serve as current clamps to limit the current that flows into the module, and during configuration points C1 and C2 can be programmed to be short-circuited to shut-off N1 and P1 and isolate the defective module. This circuit is different from and an improvement over prior art circuits. See U.S. Pat. No. 4,855,613 to M. Yamada and H. Miyamoto, "Wafer Scale Integration Semiconductor Device Having Improved Chip Power-Supply Connection Arrangement". This is because the power supply switch circuit itself only dissipates power (through R1 and R2) when it is disabled (i.e. the connection points C1 and C2 are shorted). Since in a typical wafer-scale integration the majority of the modules are good and only a small fraction of modules are defective, this circuit draws much less power than do prior art circuits.

FIG. 3(*a*) shows the power switch circuit with both N1 and P1 transistors and is capable of isolating power line shorts in circuits using two (VCC, VSS) or three (plus VBB which is a substrate back bias not shown) power supplies. If only two (VCC, VSS) power supplies are used in the device, a simpler power supply switch using only the n-channel transistor set (N1, C1 and R1) or the p-channel transistor set (P1, C2 and R2) can be implemented. Furthermore, the implementation of resistors R1 and R2 can be either simple resistive elements or active device (transistor, for example) connected into a load element.

For circuit modules consuming high supply currents, where the size of transistors N1 and P1 may be too big to be economical, a simpler direct connection method is shown in FIG. 3(*b*). Here connection points C3 and C4 may each be respectively one or more parallel connection points 70-1, 70-2, . . . , 70-i, . . . , 70-y and 72-1, 72-2, . . . , 72-i, . . . , 72-x for low series resistance when programmed. Noted that very low leakage current flows through the power supply network if the defective module is not connected to it. Again, only collection point C3 or C4 is needed if the module only uses two (VCC, VSS) power supplies. Additional fuses (which are normally short, and open when programmed), not shown, may be inserted in series with connection point C3 and/or C4 to allow subsequent removal of the module from the power supply network after it had been connected. Alternatively, connection points C3 and/or C4 may be implemented using normally-shorted programmable fuses.

Bus Architecture and Circuitry

The schematic diagram of the hierarchical parallel bus system is shown in FIG. 4(*a*). The bus is called "parallel" because data on the bus can be broadcast to and received by all the modules 16-1, . . . , 16-k simultaneously through transceivers 80-1 . . . , . . . 80-i, . . . , 80-a (marked T) and repeaters 82-1, . . . , 82-i, . . . , 82-b (marked R) without having to pass through one module 16-1 or one module group before it can be received by another module 16-i or module group. This feature is very useful for high-speed operations and is different from prior art implementations. Data transmission and reception on the bus, however, can be parallel (data are sent out on several wires at a time), or serial (data are sent out in a sequential manner with a certain timing reference) or a combination of both. The communication modes among the modules and between the modules and the outside world can be broadcasting, one-on-one, or one to a selected group. Three levels of bus hierarchy is shown where BUS0 communicates to the outside world from a bus controller 86 (marked C), BUS1 communicates between the bus controller 86 and the transceivers 80-1, . . . , 80-a (marked T) and may have repeaters 82-1, . . . , 82-b (marked R) to buffer the signals for maximum performance, BUS2 communicates between the transceivers 80-1, . . . , 80-a and the modules 16-1, . . . , 16-k (marked M). Each transceiver 80-2 drives a plurality of circuit modules 16-i+1, 16-i+1, and each controller 86 drives a plurality of transceivers and/or repeaters. The bus controller 86 can be either located on the wafer (with one or more occurrences) or located on a chip outside the wafer. Several wafer-devices and/or fractional-wafer-devices can be connected in parallel at BUS0 or BUS1 to form larger systems or systems with special requirements (such as very high speed operations).

Figure 4A:
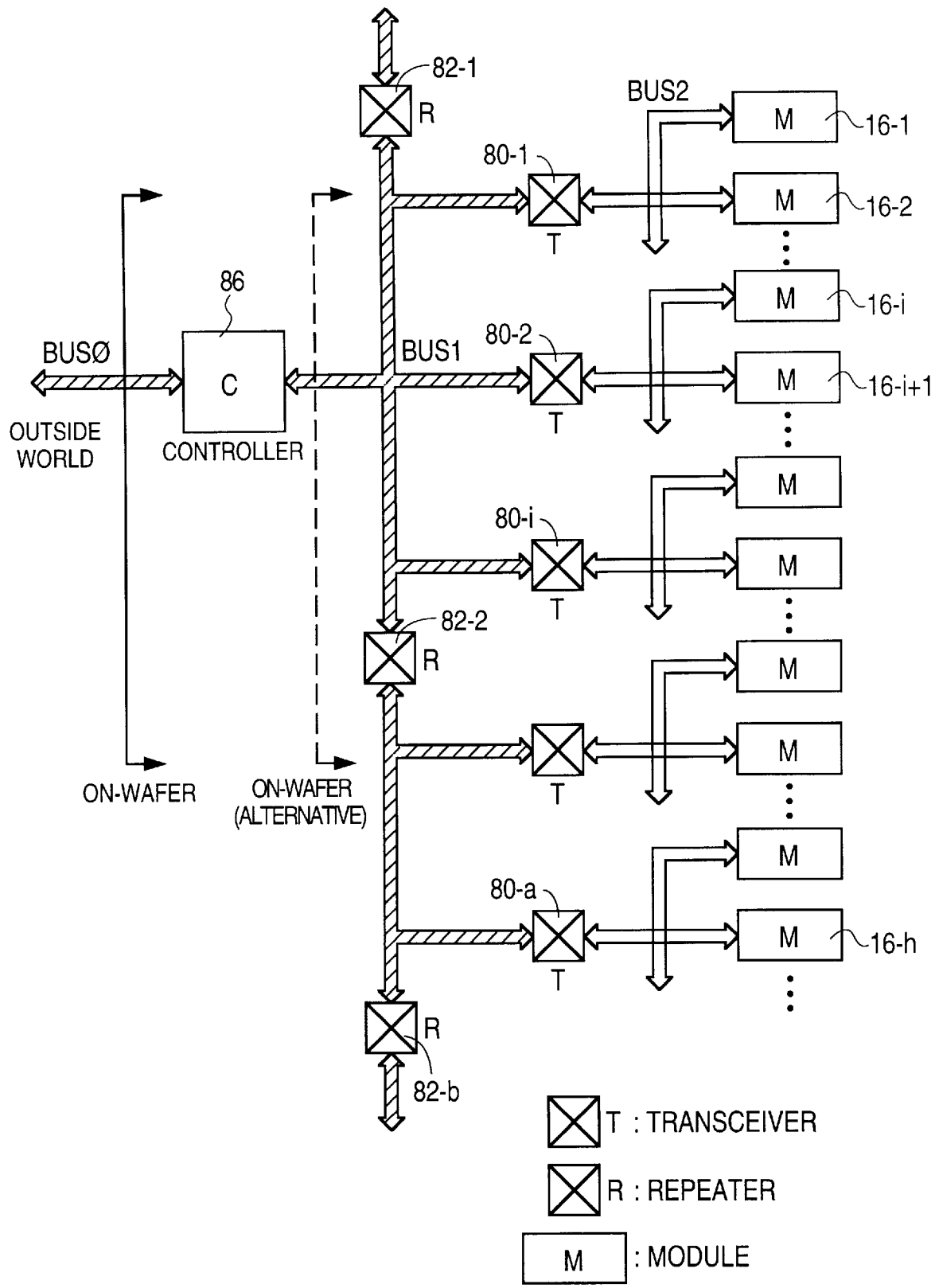
FIG. 4(a) is a schematic diagram of the hierarchical bus architecture embodiment.

Alternatively, several wafer-devices and/or fractional-wafer devices can be connected in series at BUS1 to form larger systems, in which case a second device is connected to a branch of BUS1 of a first device through a repeater (such as 82-b in FIG. 4(a)) instead of connecting to a controller.

For smaller systems or systems with less-critical speed requirements, the repeaters can be omitted. In general, BUS0 can have a variety of different widths, formats and protocols to communicate with external circuitry, and BUS1 and BUS2 usually have similar number of wires and signal definitions but may have different driving characteristics and voltage swings. In simple wafer-scale systems, BUS1 and BUS2 can be identical and the transceivers (T) are exactly the same as the repeaters (R) if there are any. Furthermore, both levels of the bus hierarchy (BUS1 and BUS2) are preferably implemented with the same segmented regular interconnection network described in FIGS. 2(a) to 2(c) for maximum configurational flexibility.

Figure 4B:
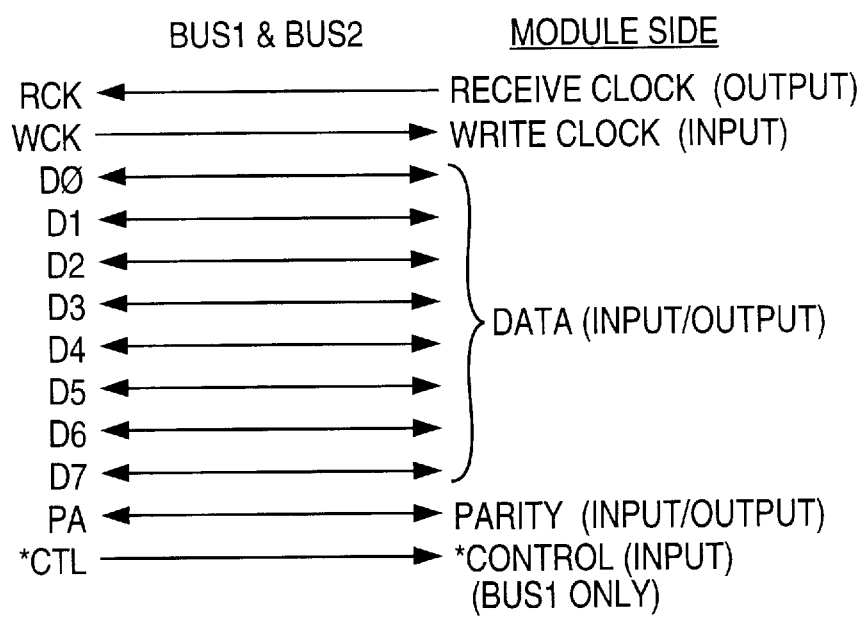
FIG. 4(b) is the signals on BUS1 and BUS2.

FIG. 4(b) shows the electrical specification of an implementation of the parallel bus. Both BUS1 and BUS2 share the majority of the bus signals, with CTL used only by BUS1. CTL, RCK and WCR are unidirectional signals and D0–D7 and PA are bidirectional signals. Although this implementation uses nine data signals, any other number of data lines (such as, 1 to 64) may be used. The two (three) unidirectional signals (RCR, WCK and CTL) are the main control and timing lines that govern the communication on the buses. The two main timing reference signals are RCK (receive clock) and WCR (write clock). WCK originates from the controller and serves as the synchronous clock for data or commands sent from controller to the circuit modules. RCK originates from an active circuit module and serves as the synchronous clock for data or commands sent from the circuit module to the controller. This unique self-timed synchronous data transmission mode (also called source-synchronous transfer mode) is useful for very high bandwidth data communication (over 500 MHz operation in a wafer-scale integration environment) because it minimizes the timing skew between data and synchronous clock and therefore allows for maximum clock and data rate physically possible in a homogeneous wafer environment. In a configuration where only one set of data transfer is permitted simultaneously, the RCK and WCK can be implemented sharing one bidirectional line while still preserving the operations and advantages of self-timed source-synchronous transfer mode.

Figure 4C:
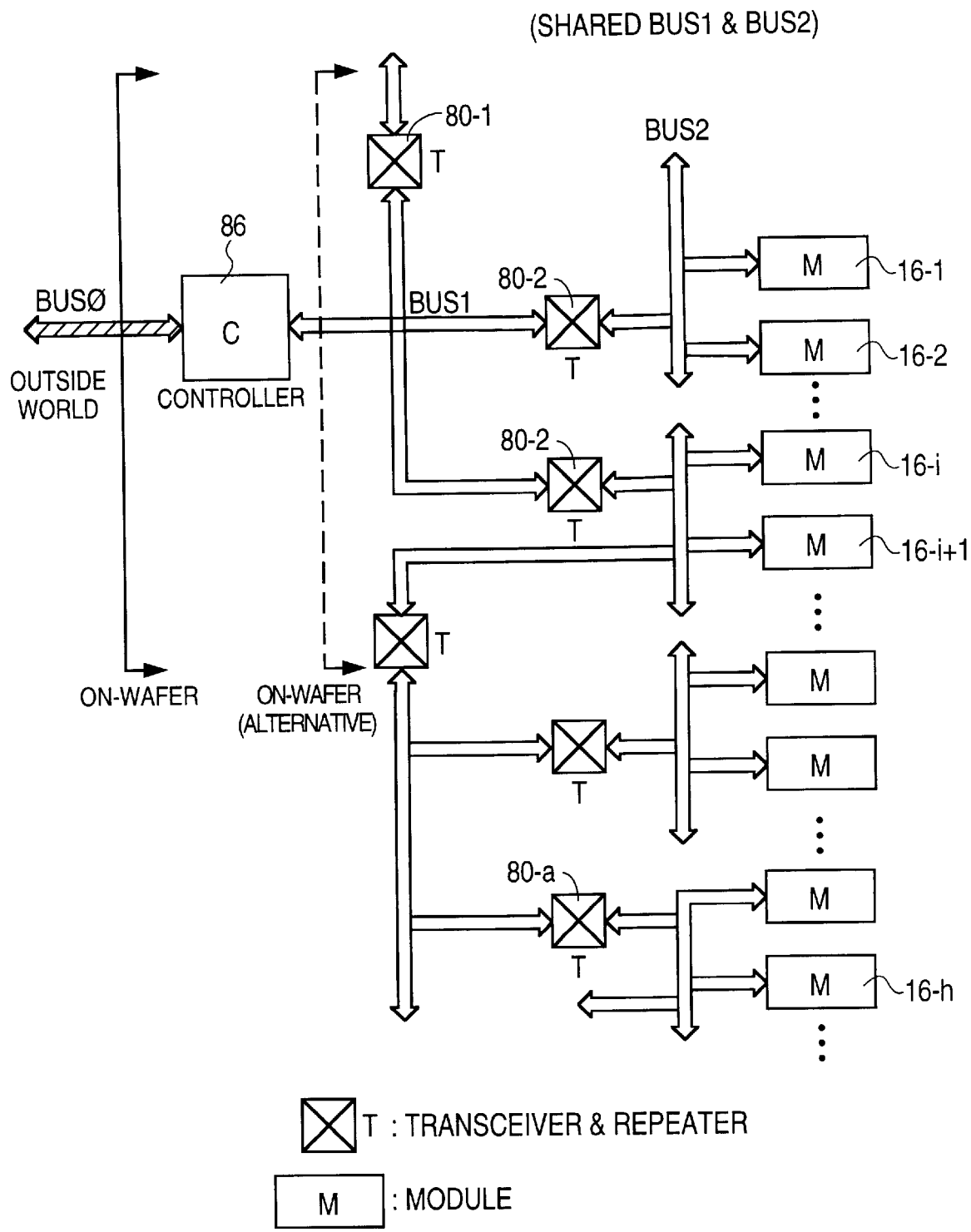
FIG. 4(c) is an implementation of the hierarchical bus architecture without the distinction between transceivers and repeaters.
Figure 4D:
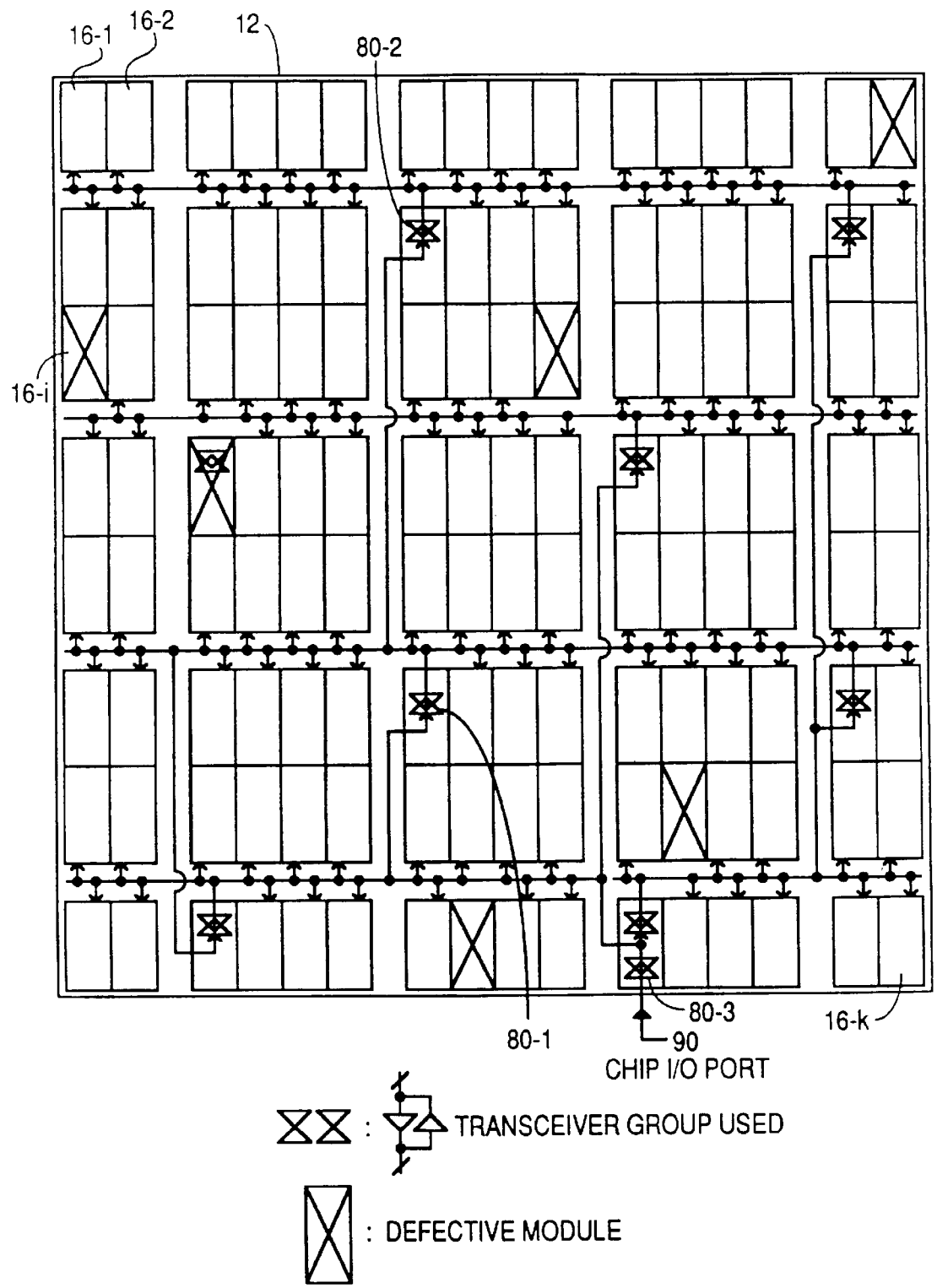
FIG. 4(d) is an example of the configured wafer-scale device following the bus architecture of FIG. 4(c).
Figure 4E:
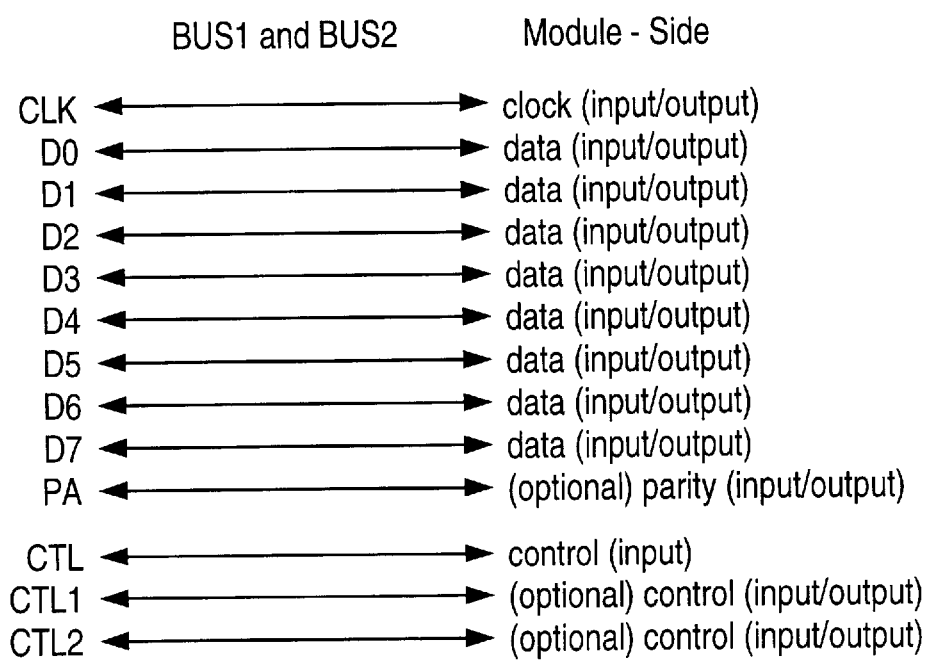
FIG. 4(e) is alternative signals on BUS1 and BUS2.

FIG. 4(e) shows an alternate embodiment of the signals on BUS1 and BUS2. Other than bidirectional data lines, there is one bidirectional clock line (CLK), one unidirectional control line (CTL), and two optional control lines (CTL1: bidirectional, CTL2: unidirectional). This timing method also uses the minimum number of wires for reference signals, and thereby minimizes the overhead in the interconnect system. In general, to minimize the yield loss from the interconnect network, the width (number of conductors) of the bus needs to be as low as possible, while from a performance standpoint, the wider the bus the more throughput the bus will have. Thus the choice of data width depends on the optimal tradeoff between cost and performance.

Although the data wires in FIGS. 4(b) and 4(e) are shown to be all bidirectional to minimize the number of wires, some of them can be configured to be unidirectional in either direction for dedicated data transfer modes or to allow multi-port operations.

FIG. 4(c) shows a variation of the hierarchical bus architecture in which the transceivers 80-1, 80-2, . . . , 80-a and the repeaters (not identified) are identical and the busses BUS1 and BUS2 are not differentiated in connecting modules and/or transceivers. This arrangement allows for greater flexibility in interconnecting and configurating the wafer scale device and still preserves near optimum performance. FIG. 4(d) shows an interconnect-routing example on a wafer-scale device 12 using the architecture shown in FIG. 4(c). Noted that all good modules such as 16-1, 16-2 are connected to the bus, with no more than three transceivers 80-1, 80-2, 80-3 between any module and the chip I/O port 90. "X" designates defective modules, such as 16-i.

Figure 4F:
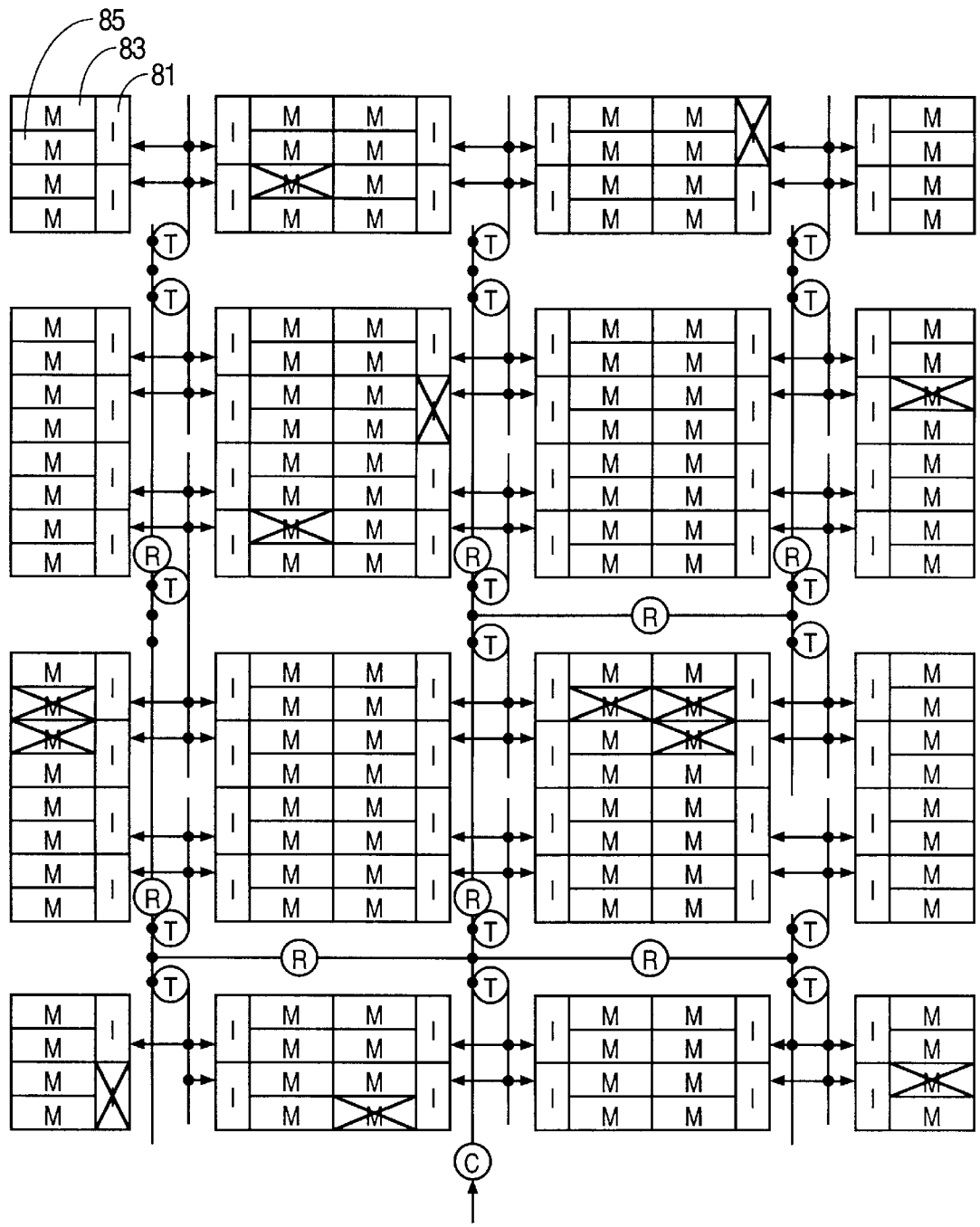
FIG. 4(f) is an example of the configured-wafer-scale device following the bus architecture of FIG. 4(a).

FIG. 4(f) shows another interconnect routing example on a wafer-scale (full wafer, fractional wafer, single or multiple lithography fields) device using the architecture shown in FIG. 4(a). The repeaters are designated as R, the transceivers as T, the chip I/O port as C, the circuit modules as M, and the interfaces as I. Note that the transceiver/repeater (TR) module circuitry is distributed and becomes part of the interconnect network and each interface I such as 81 is shared by two circuit modules 83, 85 in this example.

Figure 5A:
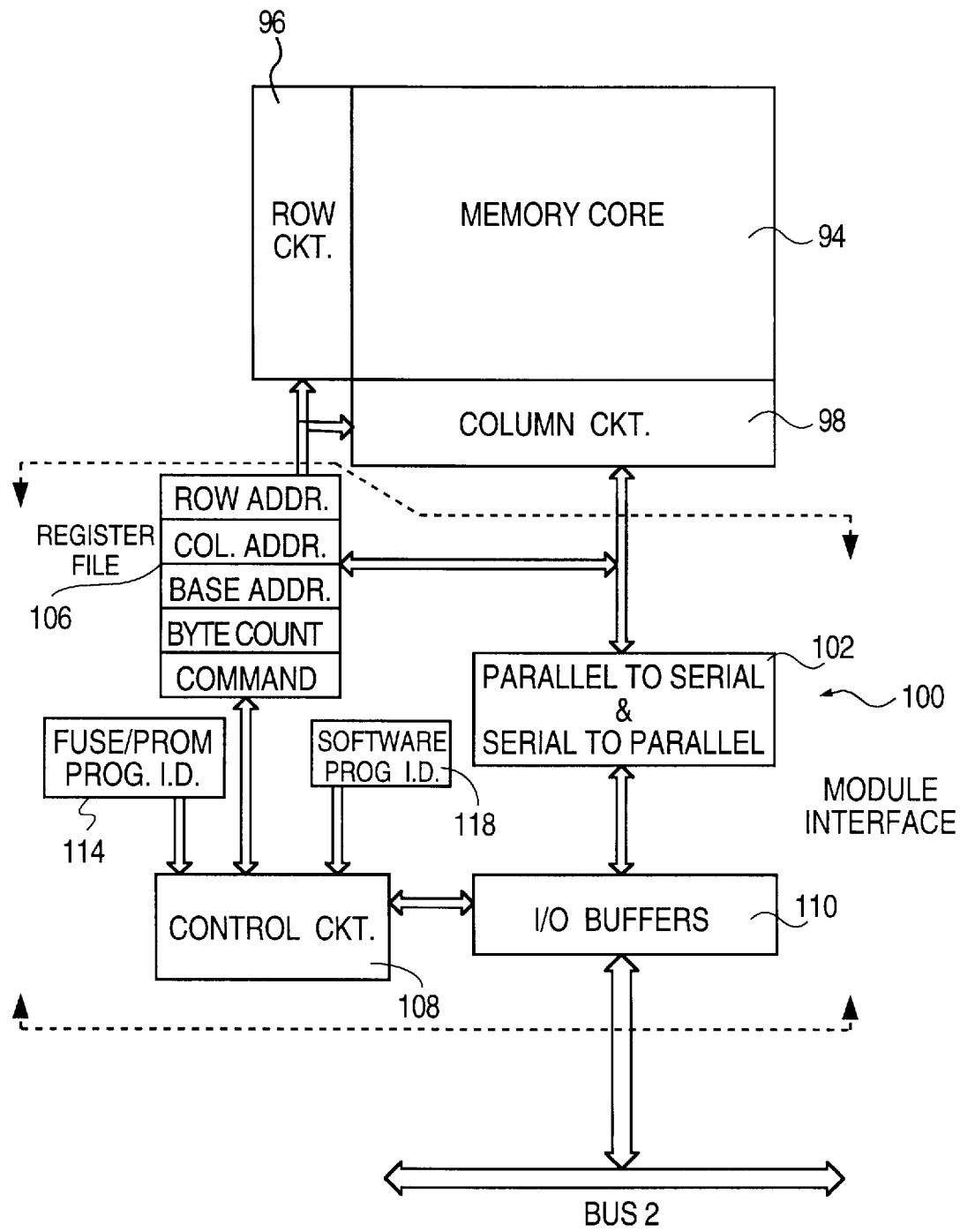
FIG. 5(a) is a schematic diagram of the module interface circuitry embodiment.

FIG. 5(a) shows a schematic diagram of a module interface circuit. A memory module is shown in this example. A memory core 94 with its associated row 96 and column circuitry 98 is connected to the interconnect network (BUS2) through the module interface 100. The parallel-to-serial and serial-to-parallel conversion circuit block 102 allows reception and transmission of commands, addresses, and data that may be wider than the data bus width (9 in the example of FIG. 4(b)). A register file 106 is maintained in the interface that generates and keeps tracks of row, column addresses, base address, and byte count for the memory access. The control circuitry 108 decodes and executes the commands, control and generate the data stream and the input/output buffers 110 as well as other tasks such as bus protocol and memory refresh. Since all the circuit modules connect to the parallel bus, an unique identification (ID) is required by each module for proper data communication on the bus. Two ID circuit blocks are shown in FIGS. 5(a,5(b). One ID block 114 uses programmable fuses (or antifuses, EPROM cell, EEPROM cell, flash EPROM cell, or other programmable switches) for initial communication network setup, system configuration, diagnostics and (optional) normal operation. The second (optional) ID circuit 118 sets up software programmable ID codes for subsequent memory access and is useful in mapping the memory space, self-test and self-reconfiguration.

Figure 5B:
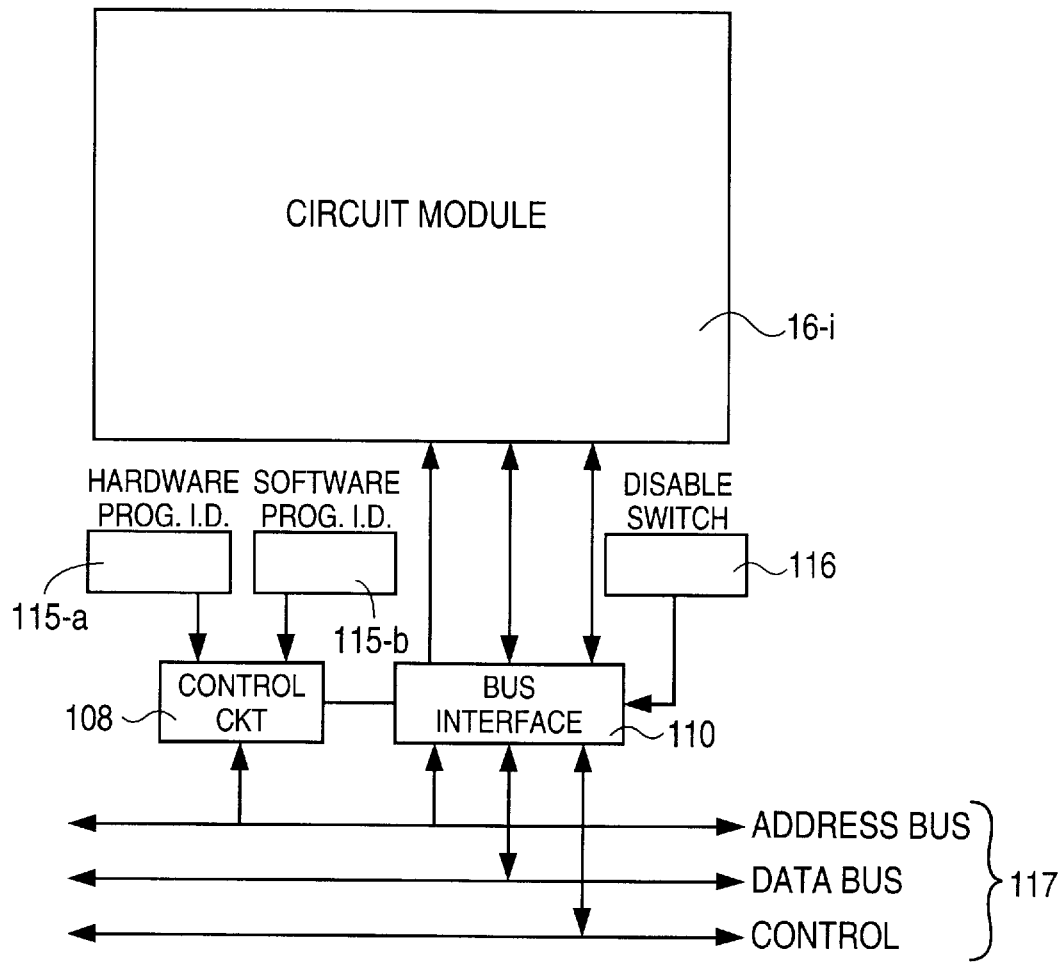
FIG. 5(b) is a schematic diagram of a generalized redundant circuit module.

This ID circuit is also the key element that implements the highly efficient redundancy architecture and circuitry disclosed herein. FIG. 5(b) shows a schematic diagram of a generalized redundant circuit module 16-i that can be used to replace other defective circuit modules. The redundant circuit module 16-i contains a programmable ID circuit 115-a and an (optional) software programmable ID circuit 115-b whereby the module 16-i can be selected by matching their unique identification code (which is part of the address) with the address signals sent to each of these circuit modules 16-i. Note that this memory-mapped addressing method is different from conventional fully-decoded memory redundancy methods (which provide redundant rows and redundant columns separately and do not permit efficient circuit module replacement), and is different from the prior art method of using a separate serial identification bus (as in U.S. Pat. No. 4,007,452) which incurs area and performance penalties. The circuit modules that can be replaced by the redundant circuit module have either preset, decoded or programmable identification codes; they also include a disable switch 116 that can be activated when the particular circuit module is defective and is to be replaced. The programmable ID circuit 115-a, 115-b, and the disable switch 116 may be implemented using fuses, antifuses, EPROM, EEPROM, flash EPROM cells or other programmable switches. The redundant circuit module and these replaceable circuit modules may be identical for more regular implementation. Also, the address, data and control signals on busses 1–17 may be distributed using any of the conventional methods or the high-speed bus described in this disclosure. This embodiment allows efficient circuit module-level replacement redundancy for much improved chip yield over conventional redundancy architectures such as those used in memory devices that only provide redundancy replacement capability to defects within the memory array area which is typically only about 50% of the memory chip area.

Figure 6A:
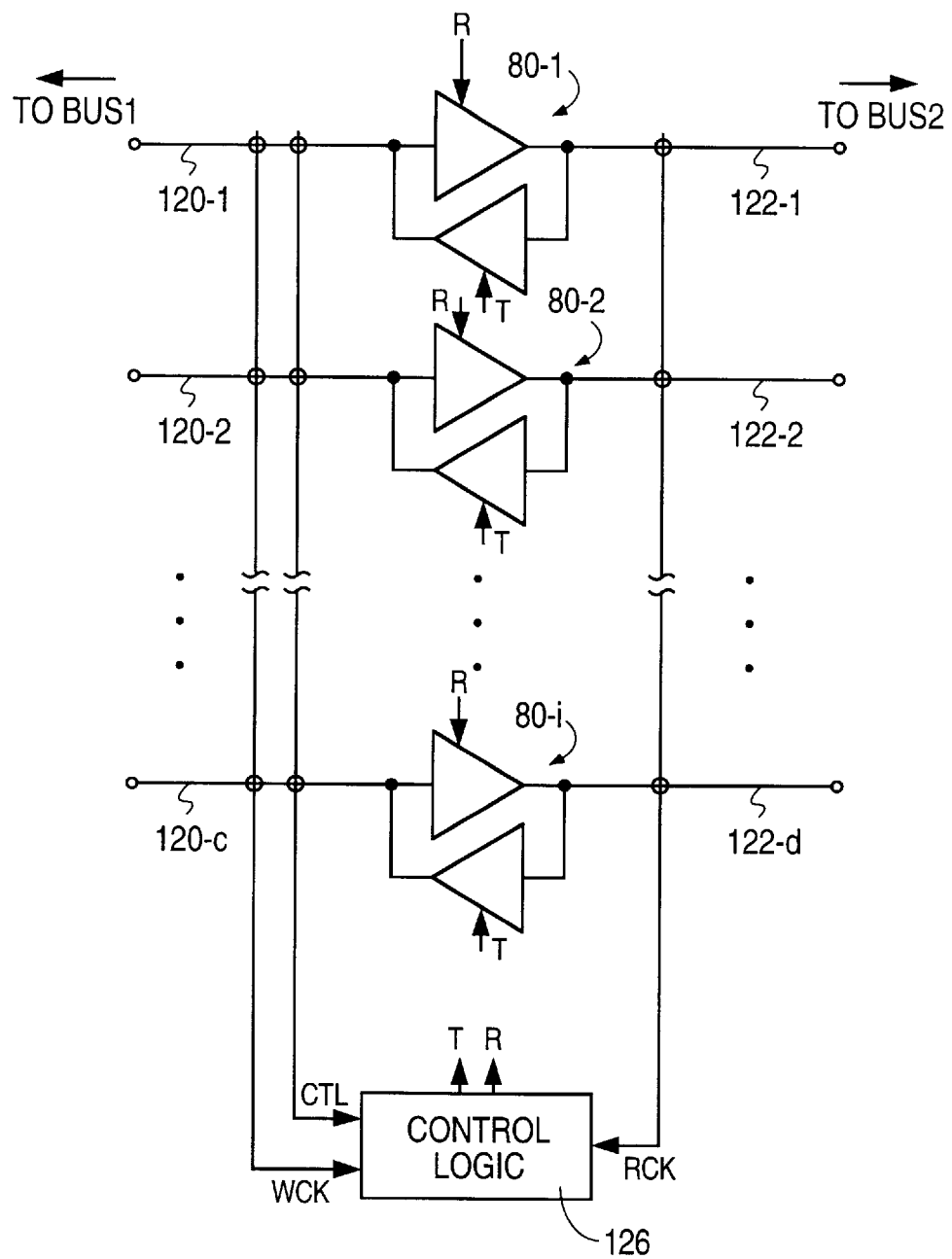
FIG. 6(a) is a schematic diagram of the transceiver circuitry embodiment.

To maintain the fully-redundant nature of the signal segments, all circuitry related to the interconnect network is uniform with respect to any wire in the segment, so that any wire in the segment can be configured to any signal in the bus. FIG. 6(a) shows the schematic diagram of the transceiver circuitry that links busses BUS1 and BUS2. Each wire 120-1, 120-2, . . . 120-c on one side of the transceiver is connected through a transceiver 80-1, 80-2, . . . , 80-i to the wire 122-1, 122-2, . . . , 122-d on the other side with two internal control signals (R: receive, and T: transmit). The control logic 126 generates the two internal control signals with three input signals (CTL, RCK and WCK) connected to the appropriate signal wires 120-1, 120-2, . . . , 120-c and 122-1, 122-2, . . . , 122-d upon configuration.

Figure 6B:
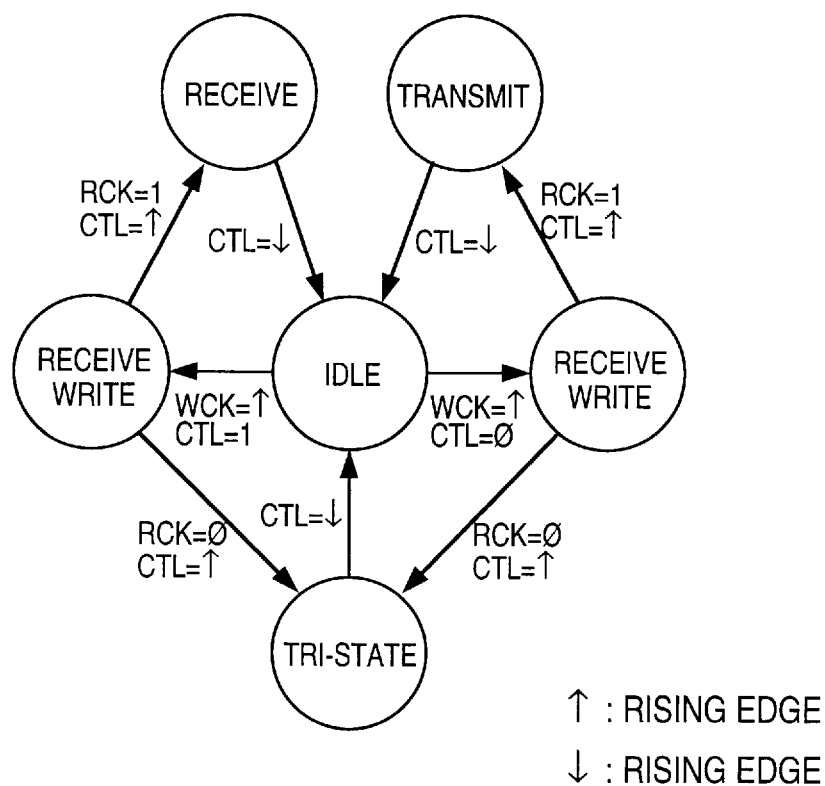
FIG. 6(b) is the state diagram of its control logic.

FIG. 6(b) shows the state diagram of the control logic 126 of the transceiver circuitry. Six states of the transceiver operations are shown: (i) IDLE: the transceiver is reset and ready to receive data from BUS1; (ii) RECEIVE WRITE: BUS1 intends to write data into certain circuit module(s); (iii) RECEIVE: the designated module(s) is attached to the transceiver and accepts data from BUS2; (iv) RECEIVE READ: BUS1 intends to read data from certain circuit module(s); (v) TRANSMIT: the designated module(s) is attached to the transceiver and transmit data into BUS2; (vi) TRI-STATE: the designated module(s) is not attached to the transceiver and the transceiver is in-active.

Although the state diagram is relatively complex, the transceiver only has three basic modes of operation (see lower portion of Fib 6(b)): (R=1,T=0), (R=0,T=1) and (R=0,T=0). The receive mode (R=1,T=0) is broken into four states to better demonstrate the typical sequences of communication operations on the buses. The signals transitions and/or levels used in the state-transition diagram is exemplary and may have many different variations.

Figure 7A:
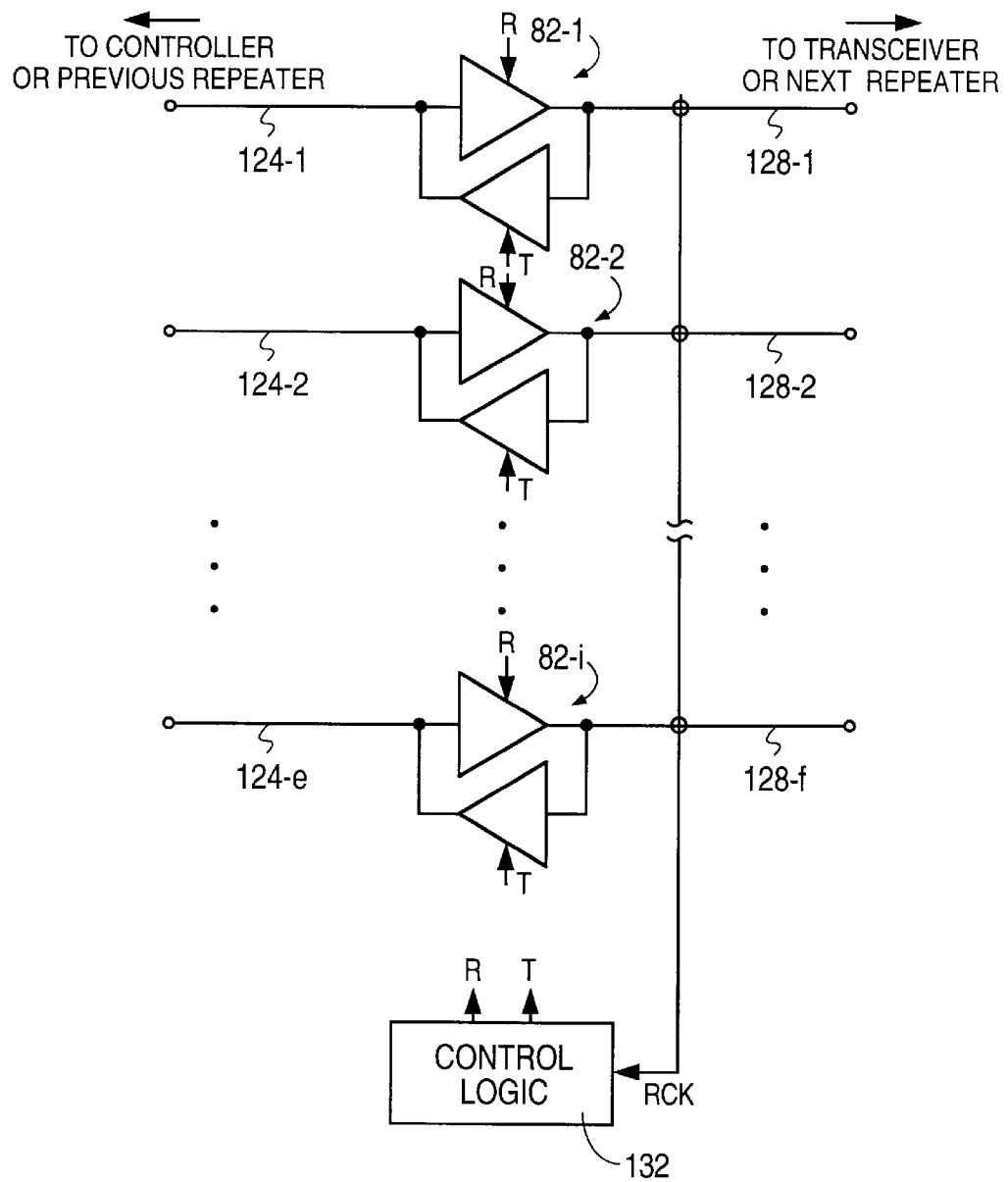
FIG. 7(a) is a schematic diagram of the repeater circuitry embodiment.
Figure 7B:
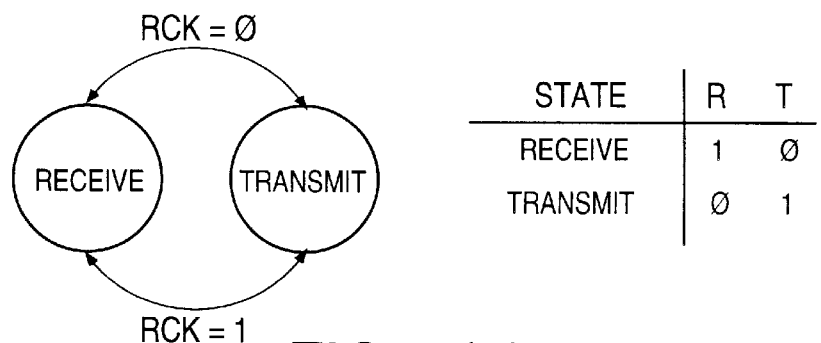
FIG. 7(b) is the state diagram of its control logic.

The schematic diagram of the repeater circuitry 82-1, . . . , 82-i is shown in FIG. 7(a). Each wire 124-1, 124-2, . . . , 124-e on one side of the repeater is connected through a transceiver to the other side 128-1, 128-2, . . . , 128-f with two internal control signals (R: receive, T: transmit). The control logic 132 generates the two internal control signals with one input signal (RCK) connected to the appropriate signal wire upon configuration. The state diagram of the control logic is shown in FIG. 7(b). Since the repeater circuitry is simpler than the transceiver circuitry, it is also possible to use part of the transceiver circuitry described in FIGS. 6a, 6b as the repeater to further minimize the number of different circuits on the wafer for further simplicity and regular arrangement.

Figures 7C, 7D:
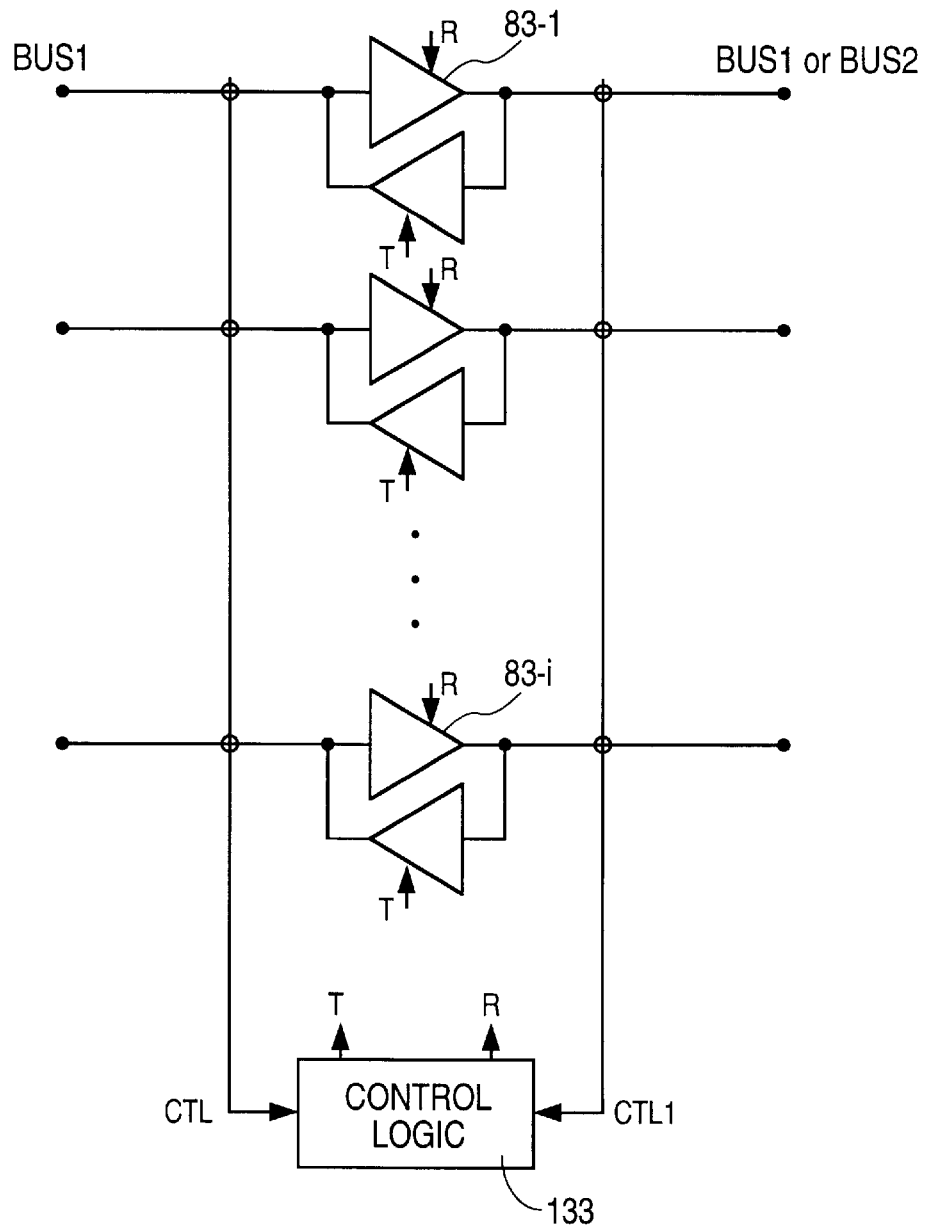
FIGS. 7(c) and 7(d) are an alternative schematic diagram of the transceiver/repeater circuitry embodiment and the state diagram of its control logic.

For the alternative embodiment with bus signals defined in FIG. 4(e), the transceiver/repeater circuitry embodiment is shown in FIGS. 7(c) and 7(d). Note that other than the differences in state transitions and the input lines to the control logic, the basic operations and configurations of the transceiver/repeater 83-i with control logic 133 are the same as shown in FIGS. 6(a), 6(b), 7(a) and 7(b).

Operationally, the bus signals described in FIG. 4(e), the hierarchical tree bus architecture described in FIG. 4(a), and the transceiver/repeater circuitry described in FIGS. 7(c) and 7(d) allow efficient communication between the circuit modules and the controller (whether on-chip or off-chip) and efficient power management where only one circuit module, one transceiver group and minimum number of repeater groups along the communication path need to be activated.

For the Read operation, the following sequence is used:
(1) the controller set to CTL=0, CTL1=1 and CTL2=0, and broadcast the command packet to all circuit modules;
(2) the controller then set to CTL1=0 to tri-state all repeaters and transceivers;
(3) the controller then set to CTL=1 to turn-around the direction of the bus;
(4) the selected circuit module pulls CTL1=1 to turn-on only the path along the bus tree between the controller and the selected circuit module and sends data packets to the controller;
(5) after all data packets are received, the controller then is set to CTL2=1 to inform all unselected circuit modules to pull CTL1=1 and turn on the rest of the bus tree;
(6) the controller then set CTL=0 and returns to idle state.

For the Write operation, the following sequence is used:
(1) the controller set to CTL=0, CTL1=1 and CTL2=0, and broadcast the command packet to all circuit modules,
(2) the controller then set to CTL1=0 to tri-state all repeaters and transceivers;
(3) the controller then set to CTL=1 to turn-around the direction of the bus;
(4) the selected circuit module pulls CTL1=1 to turn-only the path along the bus tree between the controller and the selected circuit module;
(5) the controller then set CTL=0 and sends the data packets to the selected circuit module;
(6) after all data packets are sent, the controller then is set to CTL=CTL2=1 to inform all unselected circuit modules to pull CTL1=1 and turn on the rest of the bus tree;
(7) the controller then is set to CTL=0 and returns to idle state.

For applications where partial power saving is sufficient (for example, only the Read operation uses the power saving mode while the Write operation always uses the broadcast mode), the control logic for the transceiver/repeater groups and the Read/Write operation sequences can be further simplified.

The bus signals described in FIGS. 4(b) and 4(e) include both bidirectional and unidirectional signals. The implementation of those unidirectional signals using the transceiver/repeater groups described in FIGS. 6(a), 7(a) and 7(c) can be accomplished by using discretionary programmable switches (not shown; such as fuses, antifuses, EPROM, EEPROM cells, etc.) to permanently disable one of the receiver or transmitter of the transceiver circuitry.

FIGS. 6, 7(a), 7(b), 7(c), 7(d) show the minimum functions and protocols of the implementations of the bus transceivers and repeaters for minimum area (i.e. overhead) and maximum yield. Additional functions and states may be added to handle more complicated bus protocols and accessing modes (such as protocols for allowing multiple controllers within each full- or fractional-wafer device, protocols for allowing circuit modules with varying hierarchies and priorities, and protocols for allowing more than one type of buses residing on the wafer, etc.). In those cases, only the number of input signals and the inside function of the control logic block will be different: the way of the connections that makes all input (output) wires identical to each other and therefore allowing maximum configuration flexibility should not be changed.

Other Embodiments

The above describes components in accordance with the present invention capable of building very large chip size devices with high yield and high performance. Many of the components such as high performance bus architecture, expandable device architecture, and high yield module-level redundancy architecture are novel and useful by themselves. Several examples are described hereinafter.

1. High-Performance Low-Power Device

For devices with medium to small chip sizes, the hierarchical tree bus architecture provides very high speed data transfer capability and very lower power dissipation with small area overhead whether or not the devices use any of the redundant features of the present invention. In those applications where there is minimal or no redundant circuitry, the interconnect network as well as the transceiver/repeater circuitry can be hardwired with minimal or no discretionary connections.

2. Expandable Device

The grid structure of the circuit blocks and segmented interconnect network allows one or multiple circuit blocks to be combined together into a single device and thereby allows devices with different capacity and chip sizes to be produced using a single mask set or for the same finished wafers. This capability can dramatically reduce product development cycle and minimizes inventory level. The devices themselves may be with or without redundancy.

3. Medium-Size Device With Redundancy

For devices with medium chip sizes, using only module-level redundancy may be sufficient to achieve high yield. The interconnect network can be hardwired without redundancy. The devices may use the high speed hierarchical tree bus architecture without redundancy (i.e. hardwired transceiver/repeater circuitry) or any other conventional bus methods.

Configuration Procedure

Figure 8:
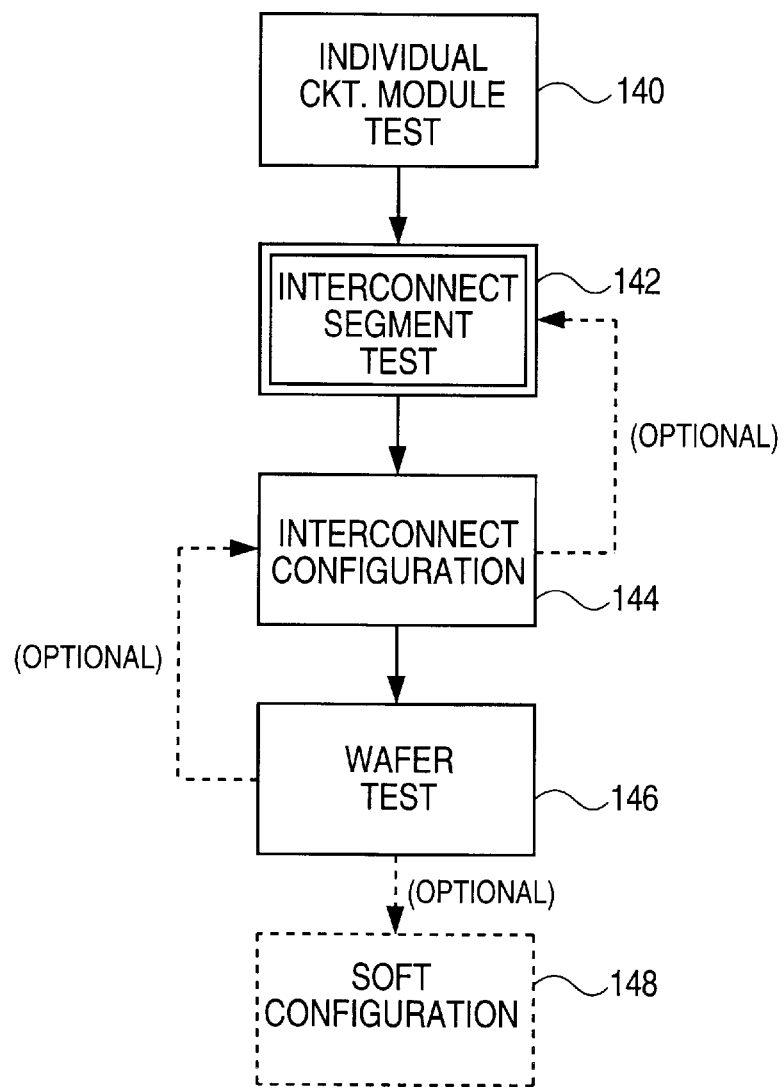
FIG. 8 is the flow chart for testing and configuring the wafer-scale device.

FIG. 8 shows the flow chart for testing and configuring the wafer-scale device. With the aid of the probe pads, in step 140 all circuit modules are 100% tested individually. Similarly, with the aid of probe pads, in step 142 all interconnect signal segments as well as power supply segments are 100% tested for defects within the segment group as well as between neighboring and cross-over segment groups and between the segment group and circuit modules. Note that all the interconnect segments are completely patterned and formed before testing is carried out, to ensure that the testing is valid and as complete as possible.

The configuration step described later should only create connected connection points, without adding traces or segments of wires that might create additional shorting defects. Any defective modules, interconnect segments, and particularly shorting defects are detected and logged by a computer that then generates an interconnect routing map that in step 144 connects only functional segments and modules and bypassing/isolating defective ones. The routing map specifies which connection points are to be connected and the configuration process are carried out. Once the configuration process is completed (or even during configuration, for on-the-fly testing), the full- or fractional-wafer device can be tested again in step 146. Any previously undetected defects, or newly-generated defects can now be bypassed or isolated using an optional re-configuration step 148 (using disconnecting fuses or other repairing system such as laser cutter or focused-ion-beam machine, for example) or simply using software re-configuration initiated by the controller. The key feature of the configuration procedure is that the interconnect segments are thoroughly formed and tested for shorting defects prior to in step 144 routing map generation, and thus ensures very high yield interconnect network after configuration.

Connection Point Construction and Programming

The connection points used in the segmented interconnect network are constructed using a variety of physical processes (fuses, antifuses and/or EPROM, EEPROM, flash EPROM, static RAM cell, and others) and programmed using a variety of processing, electrical or energy means. In the preferred embodiment the connection points are constructed as antifuses (i.e. normally open or have high resistance, and become shorted or have low resistance after programming).

Figure 9A:
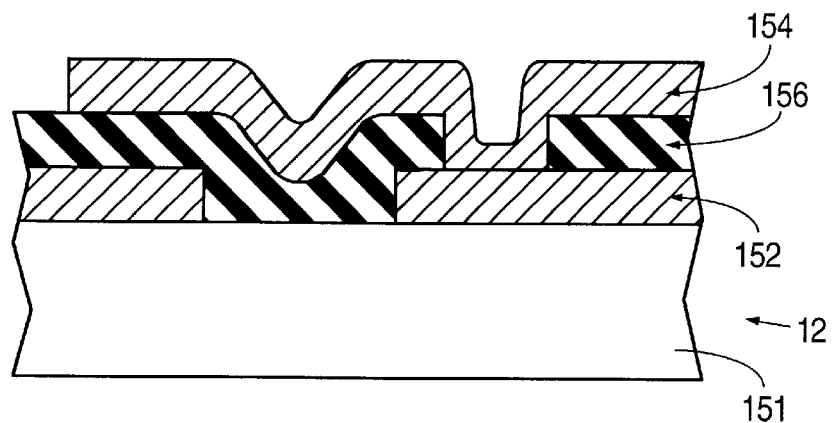
FIGS. 9(a), 9(b) and 9(c) show the process flow of configuring the connection points using semiconductor processing means.
Figure 9B:
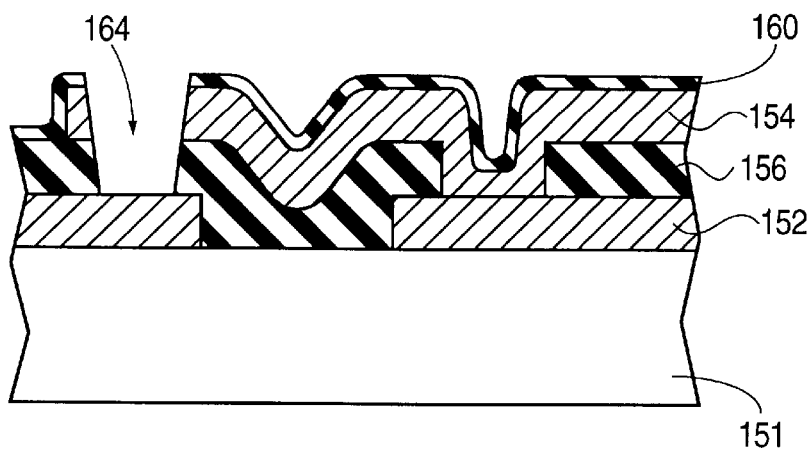
Figure 9C:
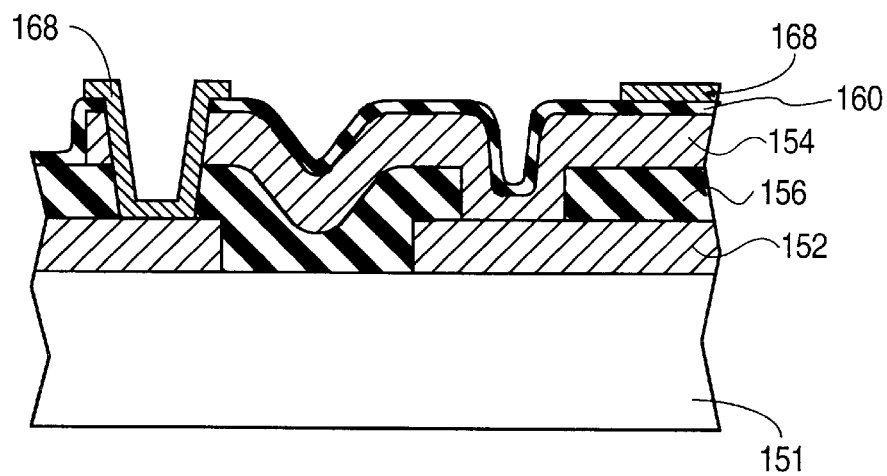

FIGS. 9(a) to 9(d) show processing using conventional masking steps for constructing the programmable connection point. FIG. 9(a) shows a cross-section of a typical wafer 12 in silicon substrate 151 already having all the interconnect layers 152, 154 patterned. The first interconnect layer 152 can be metal (in a two or more layer metal process) or silicide/polycide, and the second interconnect layer 154 is generally metal (although it can also be silicide/polycide) with an intervening dielectric layer 156. Testing of circuit modules and interconnect segments is executed at this time whether with or without an optional protection dielectric layer 160 of FIG. 9(b). Once the to-be-connected connection points are determined, they are patterned and each is etched into a through-hole 164 as shown in FIG. 9(b). Note that the patterning of the through-hole 164 can be done in a variety of ways: (1) conventional mask-making for the specific wafer and then exposing the photoresist using the custom-made mask; (2) electron-beam or laser-beam exposing the photoresist at the desired spot on the wafer directly without making any mask; (3) laser, ion, or electron-beam assisted chemical etching or ablation of the photoresist; or (4) laser, ion, or electron-beam assisted chemical etching or ablation of the metal and dielectric directly. After the through-holes 164 are formed, a layer of plug metal 168 is deposited and patterned using a common mask (all wafers share the same photomask) to complete the programming, as shown in FIG. 9(c). The plug metal 168 can be aluminum alloy or refractory metal or metal silicide.

Figure 10A:
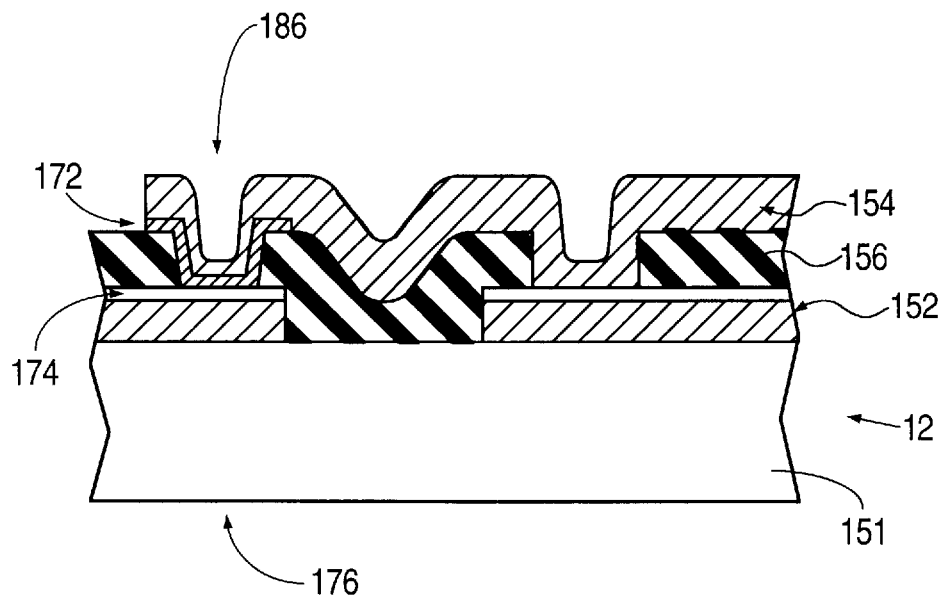
FIGS. 10(a) and 10(b) show two alternative process cross-sections for configuring the connection points using energy means.

Alternative embodiments for constructing the connection points that can be programmed using energy means are shown in FIGS. 10(a) and (b). Here the energy means is one or any combination of the following energy sources: (1) an electrical pulse applied using the probe pads to breakdown and fusing the antifuse connection point between two segments; (2) a laser beam that heats up locally the connection point and causes electrical connection between top and bottom conductors; (3) an ion beam that drills through the metal and antifuse layer and then deposits a conductive material to connect top and bottom conductors.

FIG. 10(a) shows the antifuse layer 172 sandwiched between top and bottom metal layers 152, 154. The antifuse material 172 can be amorphous silicon or oxide or their combination. The conductors 152, 154 may have barrier metals 174 (refractory metal or silicide) on both sides of the antifuse layer 172 to prevent undesirable reaction (such as aluminum alloying with silicon). To enhance the energy coupling into the connection inside the connection point 176, all or part of the aluminum in the top conductor may be removed inside the connection point 176.

Figure 10B:
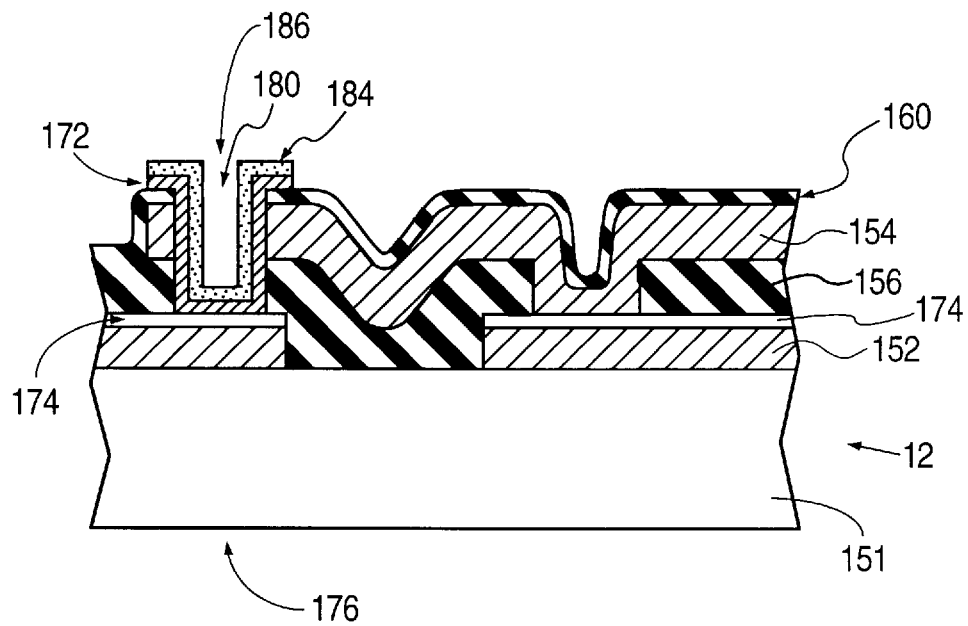

FIG. 10(b) shows an alternative embodiment in which the antifuse layer 172 is deposited into the through-hole 180 of the connection point 176 and capped by a plug metal 184. The choice of the antifuse layer 172 is such that the plug metal 184 will be connected to the top conductor 154 at the sidewall of the through-hole 180 during normal alloying (no barrier metal there) or at the same time when the bottom of the connection point is heated up by the energy means 186. The plug metal 184 and the bottom conductor 152 may have barrier metals 174 (refractory metal or silicide) on both sides of the antifuse layer with also optional top dielectric layer 160.

This disclosure is illustrative and not limiting; further modifications will be apparent to one of ordinary skill in the art in light of this disclosure and the appended claims.

We claim:

1. A method for forming a first semiconductor device having a first size and a second semiconductor device having a second smaller size using a single mask set, the method comprising the steps of:

forming a plurality of circuit blocks on a semiconductor substrate, each circuit block of said plurality of circuit blocks comprising a plurality of replaceable circuit modules;

forming programmable interconnect circuitry extending to each of the circuit modules, wherein the circuit blocks and the interconnect circuitry are fabricated from the single mask set;

testing to determine whether the replaceable circuit modules are defective or functional;

disconnecting a first set of the replaceable circuit modules from the interconnect circuitry;

connecting a second set of the replaceable circuit modules to the interconnect circuitry, the second set comprising functional circuit modules; and selecting the number of circuit modules in the second set to correspond to the first size to form the first semiconductor device, or selecting the number of circuit modules in the second set to correspond to the second size to form the second semiconductor device.

2. The method of claim 1, further comprising the steps of:

forming an input/output (I/O) port on the substrate; and forming at least one transceiver on the substrate, wherein the transceiver is located along the interconnect circuitry between the circuit modules and the I/O port.

3. The method of claim 1, further comprising the step of forming at least one transceiver on the substrate, wherein the transceiver is located along the interconnect circuitry between two of the circuit blocks.

4. The method of claim 3, further comprising the step of providing tri-state control signals to control the operation of the transceiver.

5. The method of claim 1, further comprising the step of locating the circuit blocks in a grid pattern.

6. The method of claim 1, further comprising the step of forming said each circuit block to be approximately the same size.

7. The method of claim 1, wherein the first set of replaceable circuit modules comprises the defective replaceable circuit modules.

8. The method of claim 7, wherein the first set of replaceable circuit modules further comprises one or more of said functional circuit modules.

9. The method of claim 1, wherein the first size is that of a full wafer and the second size is that of a fractional wafer.

10. The method of claim 9, wherein the fractional wafer size includes one or more of said plurality of circuit blocks.

* * * * *